(12) United States Patent
Oh et al.

(10) Patent No.: US 8,426,901 B2
(45) Date of Patent: Apr. 23, 2013

(54) SEMICONDUCTOR DEVICES HAVING A SUPPORT STRUCTURE FOR AN ACTIVE LAYER PATTERN

(75) Inventors: Chang-woo Oh, Gyeonggi-do (KR); Dong-gun Park, Gyeonggi-do (KR); Dong-won Kim, Gyeonggi-do (KR); Ming Li, Gyeonggi-do (KR); Sung-hwan Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/166,867

(22) Filed: Jun. 23, 2011

(65) Prior Publication Data

US 2011/0248376 A1    Oct. 13, 2011

Related U.S. Application Data

(62) Division of application No. 11/094,623, filed on Mar. 30, 2005, now Pat. No. 7,989,854.

(30) Foreign Application Priority Data

Aug. 6, 2004   (KR) .................. 10-2004-0061954

(51) Int. Cl.
*H01L 29/76* (2006.01)
(52) U.S. Cl.
USPC .................................. 257/288; 257/E21.415
(58) Field of Classification Search ............. 257/213, 257/288, E27.062, E27.067, E27.098
See application file for complete search history.

(56) References Cited

U.S. PATENT DOCUMENTS

| 6,645,797 | B1 | 11/2003 | Buynoski et al. |
| 6,908,816 | B1 | 6/2005 | Thurgate et al. |
| 2003/0057487 | A1 | 3/2003 | Yamada et al. |
| 2003/0111686 | A1 | 6/2003 | Nowak |
| 2004/0108559 | A1* | 6/2004 | Sugii et al. .............. 257/411 |
| 2004/0217420 | A1 | 11/2004 | Yeo et al. |
| 2005/0064669 | A1* | 3/2005 | Orlowski et al. ......... 438/295 |
| 2005/0253193 | A1 | 11/2005 | Chen et al. |
| 2007/0085134 | A1 | 4/2007 | Anderson et al. |

FOREIGN PATENT DOCUMENTS

KR    10-2003-0065864    8/2003

* cited by examiner

*Primary Examiner* — Victor A Mandala
*Assistant Examiner* — Selim Ahmed
(74) *Attorney, Agent, or Firm* — Myers Bigel Sibley & Sajovec

(57) ABSTRACT

Semiconductor devices include a semiconductor substrate with a stack structure protruding from the semiconductor substrate and surrounded by an isolation structure. The stack structure includes an active layer pattern and a gap-filling insulation layer between the semiconductor substrate and the active layer pattern. A gate electrode extends from the isolation structure around the stack structure. The gate electrode is configured to provide a support structure for the active layer pattern. The gate electrode may be a gate electrode of a silicon on insulator (SOI) device formed on the semiconductor wafer and the semiconductor device may further include a bulk silicon device formed on the semiconductor substrate in a region of the semiconductor substrate not including the gap-filing insulation layer.

10 Claims, 34 Drawing Sheets

SEMICONDUCTOR DEVICES HAVING A SUPPORT STRUCTURE FOR AN ACTIVE LAYER PATTERN

CROSS-REFERENCE TO RELATED APPLICATION

This U.S. non-provisional patent application claims priority under 35 U.S.C. §120 as a divisional of U.S. patent application Ser. No. 11/094,623, filed Mar. 30, 2005 now U.S. Pat. No. 7,989,854 which in turn claims priority under 35 U.S.C. §119 of Korean Patent Application No. 10-2004-0061954 filed on Aug. 6, 2004, the disclosure of which is hereby incorporated herein by reference in its entirety.

BACKGROUND OF THE INVENTION

The present invention relates to semiconductor devices, and more particularly, to semiconductor devices having a channel region and a method of manufacturing the same.

As the integration density of semiconductor (integrated circuit) devices increases, the distance between respective devices fabricated on a substrate of a semiconductor device decreases. As a result, it has become more difficult to prevent adjacent semiconductor devices from interfering with one another using conventional isolation methods, such as local oxidation of silicon (LOCOS) or trench isolation. Ion implantation to limit or prevent punch-through at a lower portion of an isolation layer has been proposed to address a latch-up phenomenon where adjacent semiconductor devices affect one another when operating. This type of ion implantation, however, may not be an efficient approach to provide isolation where the distance between semiconductor devices is decreased beyond the point where this type of ion implantation is effective due to the increase of the integration density of the semiconductor devices.

A silicon-on-insulator (SOI) wafer approach, which may isolate semiconductor devices from one another more efficiently than the above ion implantation technique, has been developed. An SOI wafer is typically composed of a silicon wafer, and an insulation layer and a silicon layer formed on the silicon wafer. An active layer, on which semiconductor devices are formed, is an uppermost silicon layer of such an SOI structure.

FIGS. 1 through 4 are cross-sectional views illustrating a conventional method of manufacturing an SOI wafer. Referring to FIGS. 1 and 2, a base wafer A and a bonding wafer B are prepared. The base wafer A includes a silicon wafer 10 and an oxide layer 11 formed on the silicon wafer 10. The bonding wafer B includes a silicon wafer 20, an isolation layer 21 deposited on the silicon wafer 20, and a silicon layer 22 formed on the isolation layer 21. The isolation layer 21 may be formed of a variety of materials. For example, the isolation layer 21 may be a porous silicon layer or an ion-implanted silicon layer.

As shown in FIG. 3, the bonding wafer B is placed on the base wafer A such that the silicon layer 22 of the bonding wafer B contacts the oxide layer 11 of the base wafer A, and then the resulting wafer structure is heat-treated so that the bonding wafer B is bonded to the base wafer A. As shown in FIG. 4, the isolation layer 21 is removed from the wafer structure of FIG. 3 so that the silicon wafer 20 of the bonding wafer B is separated from the base wafer A. Thereafter, the silicon layer 22 of the bonding wafer B is planarized.

As described above, an SOI structure composed of the silicon wafer 10, the oxide layer 11, and the silicon layer 22 may be formed. The silicon layer 22 serves as an active layer on which active devices, such as MOS transistors, may be formed. Therefore, the thickness of the silicon layer 22 may affect the performance of such MOS transistors. For example, in order to limit the short channel effect of MOS transistors, the thickness of the silicon layer 22 should generally be decreased.

Depending on the purpose of usage, semiconductor devices which are usually formed on different wafers, i.e., semiconductor devices formed on a bulk silicon wafer and semiconductor devices formed on an SOI structure, may need to be formed together on a single semiconductor wafer. In other words, bulk silicon is generally used when forming devices in a peripheral region, which typically requires heat dissipation and a considerable amount of current, while an SOI structure is generally used when forming devices in a cell region, which, compared to the peripheral region, generally produces little leakage current, typically only rarely suffers from latch-up, and generally does not require as much heat dissipation. For example, an electrostatic prevention device, to which a high electric field is applied, may be formed in the peripheral region on a bulk silicon wafer, and a memory device, which stores data therein, may be formed in the cell region on an SOI structure.

In a conventional method of forming an SOI structure, however, bonding, separating, and polishing of the SOI structure should generally be performed separately from one another. In other words, an SOI structure region typically should be formed in a semiconductor wafer by using the processes illustrated in FIGS. 1 through 4, and then a bulk silicon region should be formed by removing the SOI structure region from the semiconductor wafer, which typically results in an increase in the manufacturing costs of the semiconductor devices and may make mass production of the semiconductor devices more difficult and/or expensive.

SUMMARY OF THE INVENTION

Embodiments of the present invention provide semiconductor devices including a semiconductor substrate and a stack structure protruding from the semiconductor substrate and surrounded by an isolation structure. The stack structure includes an active layer pattern and a gap-filling insulation layer between the semiconductor substrate and the active layer pattern. A gate electrode extends from the isolation structure around the stack structure and is configured to provide a support structure for the active layer pattern. The gate electrode may be a gate electrode of a silicon on insulator (SOI) device formed on the semiconductor wafer and the semiconductor device may further include a bulk silicon device formed on the semiconductor substrate in a region of the semiconductor substrate not including the gap-filing insulation layer.

In some embodiments of the present invention, the gap-filling insulation layer is an oxide layer, a nitride layer and/or a silicon layer. The gap-filling insulation layer may be a stack structure including an oxide layer, a nitride layer and a silicon layer. An isolation layer may be provided on the active layer pattern and the gate electrode may be on the isolation layer.

In other embodiments of the present invention, semiconductor devices include a semiconductor substrate and a stack structure protruding from the semiconductor substrate and surrounded by an isolation structure. The stack structure includes an active layer pattern and a gap-filling insulation layer between the semiconductor substrate and the active layer pattern. The isolation structure includes a supporting isolation layer coupled to the active layer pattern that is configured to provide a support structure for the active layer pattern.

In yet further embodiments of the present invention, methods of manufacturing a semiconductor device include forming an active region including a sacrificial layer pattern and an active layer pattern on the sacrificial layer pattern on a semiconductor substrate. A recessed isolation layer is formed that exposes the sacrificial layer pattern. A support structure is formed coupled to the sacrificial layer pattern extending from the recessed isolation layer. A gate electrode pattern is formed on the active region. A void is formed under the active region by removing the sacrificial layer pattern and the formed void is filled with a gap-filling insulation layer to define an SOI device region on the semiconductor substrate. The semiconductor device may have a channel region defined by an insulation layer.

In other embodiments of the present invention, forming an active region includes forming a fin-shaped active region protruding from the semiconductor substrate and forming a support structure includes forming the gate electrode pattern extending from the recessed isolation layer and coupled to sidewalls of the sacrificial layer pattern. The methods may further include forming a gate insulation layer on a top surface of the active layer pattern and on sidewalls of the active layer pattern. The gate electrode pattern may extend along the top surface and sidewalls of the gate insulation layer. The sacrificial layer pattern may be a material layer that has substantially a same lattice constant as the active layer pattern and has a high etching selectivity relative to the active layer pattern. The sacrificial layer pattern may be formed of epitaxial SiGe. The active layer pattern may be formed of a material layer epitaxially grown using $SiH_4$, $SiH_2Cl_2$, $SiCl_4$, or $Si_2H_6$ as a silicon source gas.

In further embodiments of the present invention, forming the fin-shaped active region includes sequentially forming a sacrificial layer, an active layer, a pad oxide layer, and a nitride layer on the semiconductor substrate. A first photoresist pattern is formed that defines an active region on the nitride layer. The nitride layer, the pad oxide layer, the active layer, and the sacrificial layer are etched using the first photoresist pattern as an etching mask. Forming the recessed isolation layer may include exposing the active layer pattern by planarizing a nitride layer pattern and a pad oxide layer pattern, which are obtained by etching the nitride layer and the pad oxide layer, respectively, forming a second photoresist pattern on the exposed active layer pattern, and etching an isolation layer using the second photoresist pattern as an etching mask such that the isolation layer can be recessed to expose the sidewalls of the sacrificial layer pattern. The gate insulation layer may be a thermal oxide layer, an oxide layer, an oxide-nitride-oxide (ONO) layer, and/or a structure between an uppermost gate and channel of a non-volatile memory.

In some embodiments of the present invention, the gate electrode pattern defined support structure prevents the gate insulation layer and the active layer pattern from collapsing after forming a void under the active region. The sacrificial layer pattern may be removed through wet etching and/or dry etching. The sacrificial layer pattern may be removed through isotropic dry etching using an etchant including peracetic acid and a mixture of $H_2O_2$, HF, and/or $CH_3COOH$. The gap-filling insulation layer may be an oxide layer, a nitride layer, and/or a silicon layer. The gap-filling insulation layer may be a stack structure including a first oxide layer, a nitride layer, and a second oxide layer.

In yet other embodiments of the present invention, the methods further include, after filling the formed void with the gap-filling insulation layer, forming a lightly doped drain (LDD) impurity layer or a source and drain expansion (SDE) impurity layer by implanting or diffusing first source and drain impurity ions into the active layer pattern using the gate electrode pattern as an ion implantation mask. First spacers are formed on the sidewalls of the gate electrode pattern and a highly doped drain (HDD) impurity layer is formed by implanting or diffusing second source and drain impurity ions into the active layer pattern using the gate electrode pattern and the first spacers as an ion implantation mask. The methods may further include, before the forming the fin-shaped active region, partially exposing the semiconductor substrate by removing the active layer pattern from a bulk silicon device region on the semiconductor substrate where a bulk silicon device is to be formed.

In further embodiments of the present invention, forming an active region includes forming a fin-shaped active region protruding from the semiconductor substrate. The methods further include forming a gate insulation layer on a top surface of the active layer pattern and forming a first hard mask pattern on the gate insulation layer. In such embodiments, forming a support structure includes forming a gate electrode pattern that extends along the top surface of the first hard mask pattern and the sidewalls of the active layer pattern and the sacrificial layer pattern. The first hard mask pattern may be a silicon nitride layer. The sidewalls of the first hard mask pattern may be aligned with sidewalls of the active layer pattern and the sacrificial layer pattern. The gate electrode pattern defined support structure may prevent the gate insulation layer and the active layer pattern from collapsing after forming a void under the active region. After the filling the formed void with the gap-filling insulation layer, the gap-filling insulation layer and the active layer pattern may be removed such that a predetermined region of the semiconductor wafer is exposed.

In other embodiments of the present invention, methods of manufacturing a semiconductor device include forming an active region that includes a sacrificial layer pattern and an active layer pattern on a semiconductor substrate. An isolation layer is formed such that the top surface of the isolation layer is substantially on a same plane as a top surface of the active layer pattern. A gate insulation layer pattern and a gate electrode pattern are formed such that the gate insulation layer pattern is interposed between the gate electrode pattern and the active layer pattern and between the gate electrode pattern and the isolation layer. A recessed isolation layer is formed by etching the isolation layer using the gate electrode pattern and the active layer pattern as etching masks such that sidewalls of the sacrificial layer pattern are exposed, and forming a supporting isolation layer under the gate electrode pattern that extends along the sidewalls of the sacrificial layer pattern and the active layer pattern. A void is formed by removing the sacrificial layer pattern and the void is filled with a gap-filling insulation layer.

In yet further embodiments of the present invention, semiconductor devices having a channel area defined by an insulation layer include an active layer pattern, which protrudes from a semiconductor wafer and is deposited on a gap-filling insulation layer. A gate electrode is provided, which covers at least both sidewalls of one of the active layer pattern and the gap-filling insulation layer. The active layer pattern may have a rectangular cross section, have a rounded upper edge, and/or be cylindrical. The gap-filling insulation layer may be composed of at least one of an oxide layer, a nitride layer, and/or a silicon layer. An isolation layer may be provided on which the gate electrode is formed, the isolation layer being recessed at either side of the gap-filling insulation layer. In addition, spacers may be provided, which are formed of nitride on sidewalls of the active layer pattern and the gap-filling insulation layer and on the isolation layer.

In other embodiments of the present invention, semiconductor devices having a channel region defined by an insulation layer include an active layer pattern deposited on a gap-filling insulation layer on a semiconductor wafer. A supporting isolation layer covers the sidewalls of the active layer pattern and the gap-filling insulation layer. The gap-filling insulation layer may be composed of at least one of an oxide layer, a nitride layer, and/or a silicon layer. The gap-filling insulation layer may be an ONO layer, which is a stack of a first oxide layer, a nitride layer, and a second oxide layer. A gate electrode pattern may be provided, which is formed on a recessed isolation layer at either side of the gap-filling insulation layer. Spacers may be provided that are formed of nitride on the sidewalls of the active layer pattern and the gap-filling insulation layer and on the recessed isolation layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
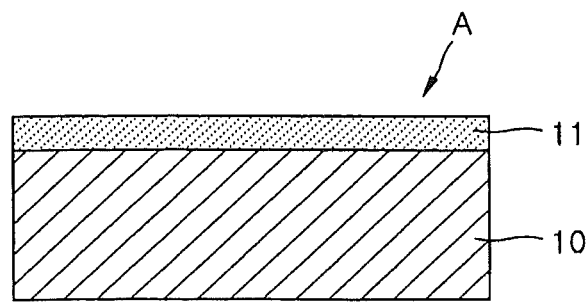
FIGS. 1 through 4 are cross-sectional views illustrating a conventional method of manufacturing an SOI wafer.
Figure 2:
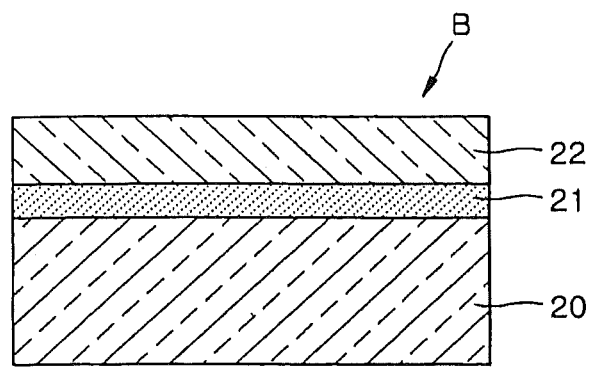
Figure 3:
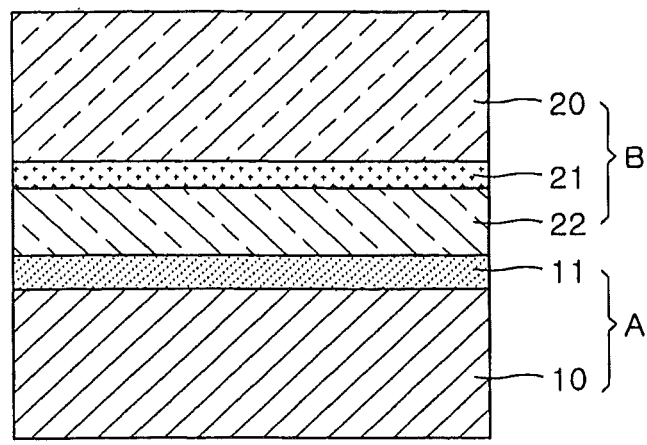
Figure 4:
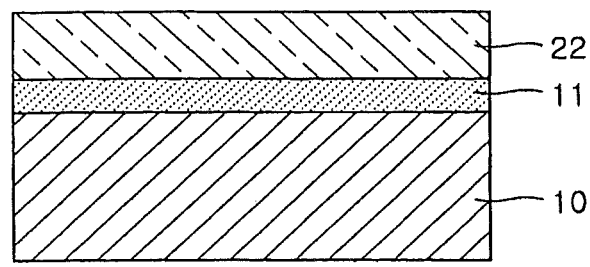

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments of the present invention provide a semiconductor device that enables a device (hereinafter referred to as a bulk silicon device), which is usually formed on a bulk silicon wafer, and a device (hereinafter referred to as an SOI wafer device), which is usually formed on an SOI wafer, to be formed together on a common semiconductor wafer. Various embodiments of the present invention also provide methods of manufacturing a semiconductor device that enables a bulk silicon device and an SOI wafer device to be formed together on a single semiconductor wafer.

Various embodiments of the present invention will now be described with reference to the figures. FIGS. 5A through 12C are cross-sectional or perspective views illustrating a method of manufacturing a semiconductor device according to some embodiments of the present invention. The semiconductor device that will be described in detail with reference to these figures may be referred to as a fin-shaped triple gate semiconductor device.

Figure 5A:
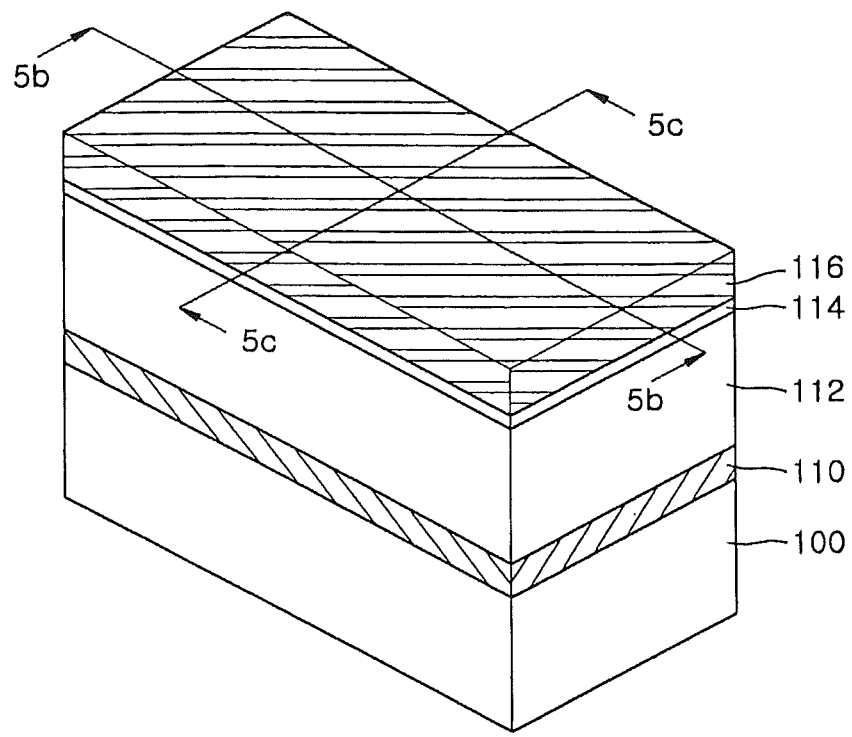
FIGS. 5A through 12C are cross-sectional or perspective views illustrating methods of manufacturing a semiconductor device according to some embodiments of the present invention.
Figure 5B:
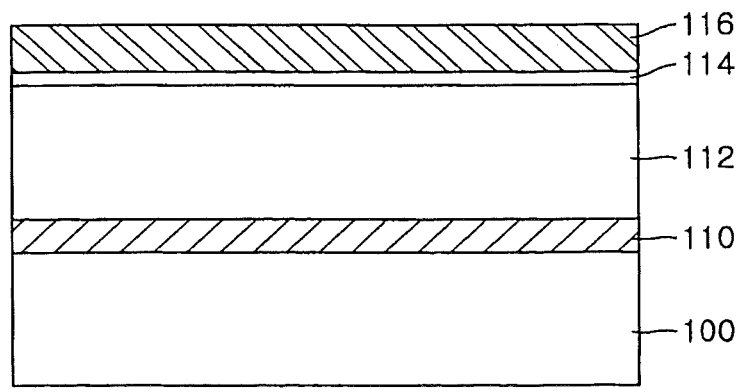
Figure 5C:
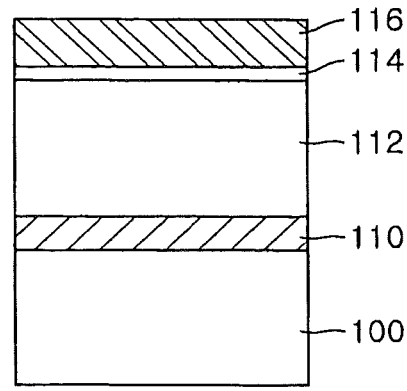

FIG. 5A is a perspective view illustrating a structure obtained by forming a sacrificial layer 110 and an active layer 112 on a semiconductor (integrated circuit) wafer 100. FIG. 5B is a cross-sectional view taken along line 5b-5b of FIG. 5A, FIG. 5C is a cross-sectional view taken along line 5c-5c of FIG. 5A. Referring to FIGS. 5A through 5C, the sacrificial layer 110 and the active layer 112 may be sequentially formed on the semiconductor wafer 100, which may be a silicon wafer. The sacrificial layer 110 and the active layer 112, in some embodiments of the present invention, are formed through epitaxial growth so that their thicknesses may be easily adjusted. The active layer 112, in some embodiments of the present invention, is formed to have a thickness selected so that a sufficient length of a channel region can be secured, in which case, the sacrificial layer 110 may be formed of a material having almost the same lattice constant and having an etching selectivity with respect to the active layer 112. For example, when the active layer 112 is an epitaxial Si layer, the sacrificial layer 110 may be an epitaxial SiGe layer. The sacrificial layer 110 may be planarized through, for example, hydrogen annealing, if desired.

The sacrificial layer 110 may be formed by using a molecular beam epitaxy method. When epitaxially growing the sacrificial layer 110, $SiH_4$, $SiH_2Cl_2$, $SiCl_4$, and/or $Si_2H_6$ gas may be used as a source of Si gas, and $GeH_4$ gas may be used as a source of Ge gas. The active layer 112 may also be formed by using, for example, the molecular beam epitaxy method. When epitaxially growing the active layer 112, $SiH_4$, $SiH_2Cl_2$, $SiCl_4$, and/or $Si_2H_6$ gas may be used as a source of Si gas A pad oxide layer 114 and a nitride layer 116 may then be sequentially deposited on the active layer 112. The pad oxide layer 114 may be formed to reduce stress between the semiconductor wafer 100 and the nitride layer 116. The pad oxide layer 114 may be formed to have a thickness of about 20-200 Å. The pad oxide layer 114 may be formed to have a thickness of about 100 Å. The nitride layer 116 may be used as a hard mask when performing an etching process for forming a shallow trench isolation (STI) region. The nitride layer 116 may be formed by depositing silicon nitride on the pad oxide layer 114 to a thickness of about 500-2000 Å. The nitride layer 116, in some embodiments, is formed to have a thickness of about 800-850 Å. When depositing silicon nitride on the pad oxide layer 114 to form the nitride layer 116, a conventional deposition method, such as chemical vapor deposition (CVD), sub-atmospheric CVD (SACVD), low pressure CVD (LPCVD), or plasma enhanced CVD (PECVD), may be used.

A region (hereinafter referred to as bulk silicon device region), in which a bulk silicon device is to be formed, is formed by removing the sacrificial layer 110 from the structure of FIGS. 5A, 5B, and 5C. The bulk silicon device may be a type of device that is generally formed on a bulk silicon wafer. A photoresist pattern may then be formed to protect the bulk silicon device region, and subsequent processes may be performed on a resulting structure, thereby forming an SOI device. The SOI device may be a type of device that is generally formed on an SOI wafer.

Figure 6A:
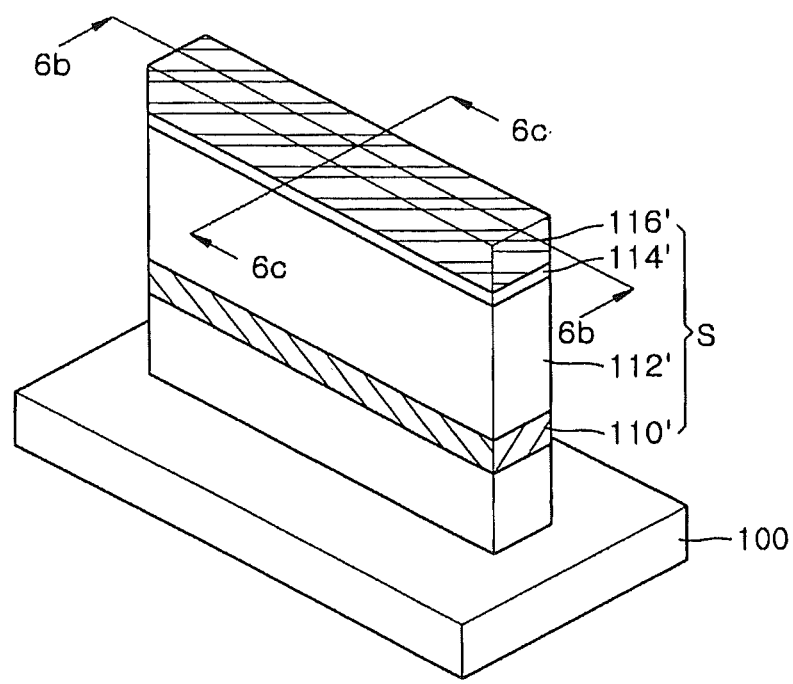
Figure 6B:
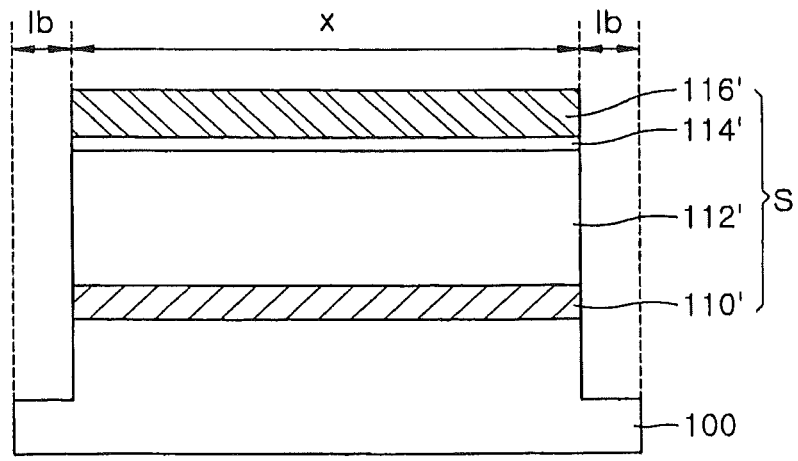
Figure 6C:
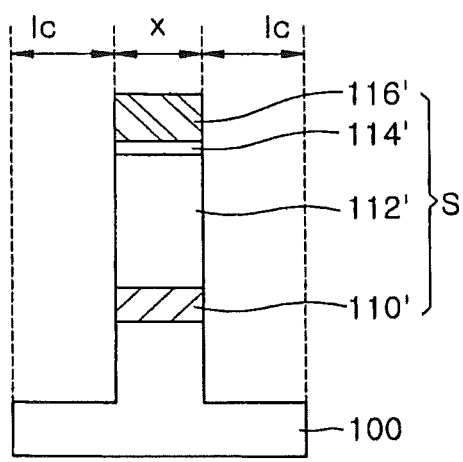

FIG. 6A is a perspective view illustrating a structure obtained by forming isolation regions Ib and Ic (see FIGS. 6B and 6C) on the structure of FIGS. 5A, 5B, and 5C. FIG. 6B is a cross-sectional view taken along line 6b-6b of FIG. 6A. FIG. 6C is a cross-sectional view taken along line 6c-6c of FIG. 6A. A first photoresist pattern (not shown) that defines an active region X may be formed on the nitride layer 116. Thereafter, a stack pattern S, which is composed of a nitride layer pattern 116', a pad oxide layer pattern 114', an active layer pattern 112', and a sacrificial layer pattern 110', may be formed by etching the nitride layer 116, the pad oxide layer 114, the active layer 112, and the sacrificial layer 110 using the first photoresist pattern as an etching mask.

The isolation regions Ib and Ic, which are formed surrounding the active region X, are exposed on the semiconductor wafer 100 by the stack pattern S. More particularly, the isolation regions Ib and Ic may be formed by removing the first photoresist pattern and then anisotropically dry-etching the semiconductor wafer 100 using the stack pattern S as an etching mask. The first photoresist pattern may be removed by a conventional method. For example, an ashing process may be performed on the first photoresist pattern using oxygen plasma, and then the first photoresist pattern may be removed using an organic strip. The isolation regions Ib and Ic may be formed to have a depth sufficient to provide a desired isolation. The active layer pattern 112' may be formed having a rectangular cross section, may be formed with a rounded upper edge, or may be formed as a cylinder in various embodiments of the present invention.

Figure 7A:
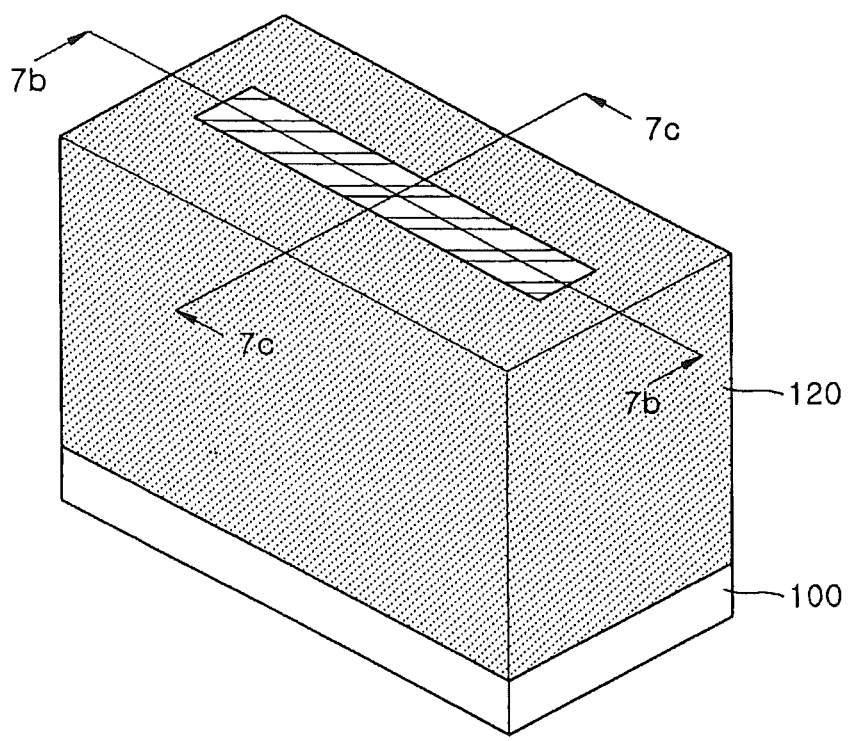
Figure 7B:
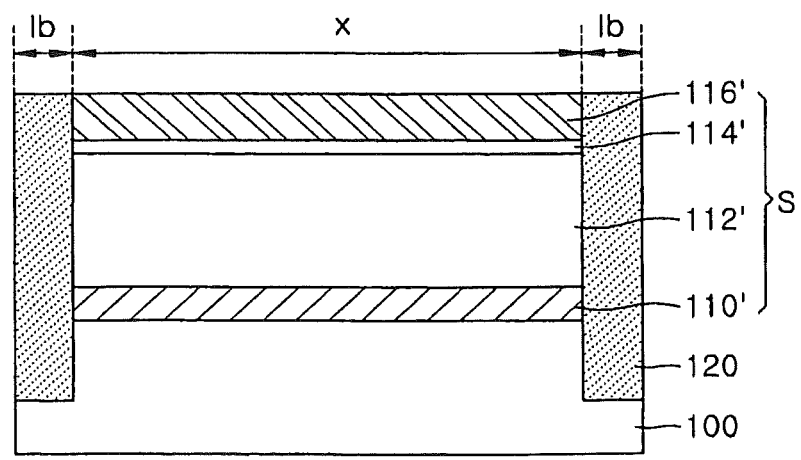
Figure 7C:
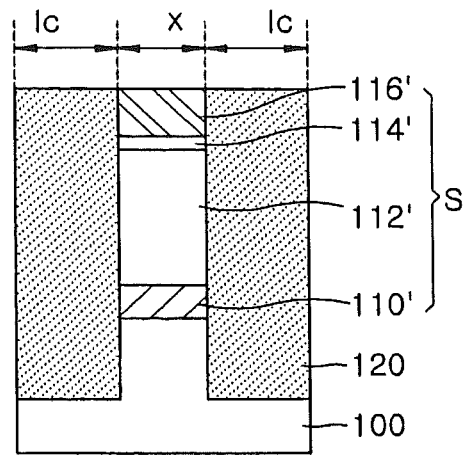

FIG. 7A is a perspective view illustrating a structure obtained by forming an isolation layer 120 on the structure of FIGS. 6A, 6B, and 6C. FIG. 7B is a cross-sectional view taken along line 7b-7b of FIG. 7A. FIG. 7C is a cross-sectional view taken along line 7c-7c of FIG. 7A. As shown in the embodiments FIGS. 7A through 7C, an isolation layer 120 (e.g., an oxide layer) is formed on the semiconductor wafer 100, on which the isolation regions Ib and Ic are formed, so that sidewalls of the stack pattern S are surrounded by the isolation layer 120. The isolation layer 120 may be an insulation layer such as an undoped silica oxide (USG) layer, a high density plasma (HDP) oxide layer, a tetraethylorthosilicate (TEOS) layer formed through PECVD, an oxide layer formed through PECVD, and/or any combinations thereof.

In some embodiments of the present invention, an HDP oxide layer, which is generally a very dense layer, is used as the material of the isolation layer 120. In particular, HDP CVD, which is a combination of CVD and sputtering-based etching, may enable not only deposition gas, which is used for depositing a material layer on the semiconductor wafer 100, but sputtering gas, which is used for etching the material layer through sputtering, to be provided into a chamber where the semiconductor wafer 100 is loaded. Therefore, for example, $SiH_4$ and $O_2$ may be supplied into the chamber as deposition gas, and an inert gas, such as Argon (Ar) gas, may be supplied into the chamber as a sputtering gas. Part of the deposition gas and the sputtering gas supplied into the chamber may be ionized by plasma generated in the chamber. As high-frequency biased power is typically applied to a wafer chuck (e.g., an electrostatic chuck) inside the chamber, ions of the deposition and sputtering gases may be accelerated toward the surface of a semiconductor wafer 100 on the wafer chuck. The accelerated ions of the deposition gas may form a silicon oxide layer, and the accelerated ions of the sputtering gas may sputter the silicon oxide layer. Accordingly, when formed by depositing an HDP oxide layer in the above described manner, the isolation layer 120 may be very dense and may exhibit excellent gap filling characteristics.

Figure 8A:
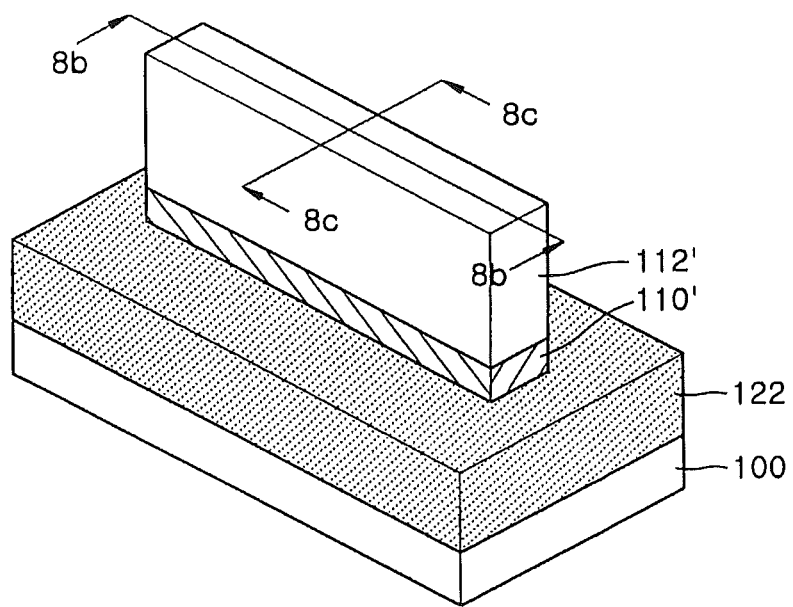
Figure 8B:
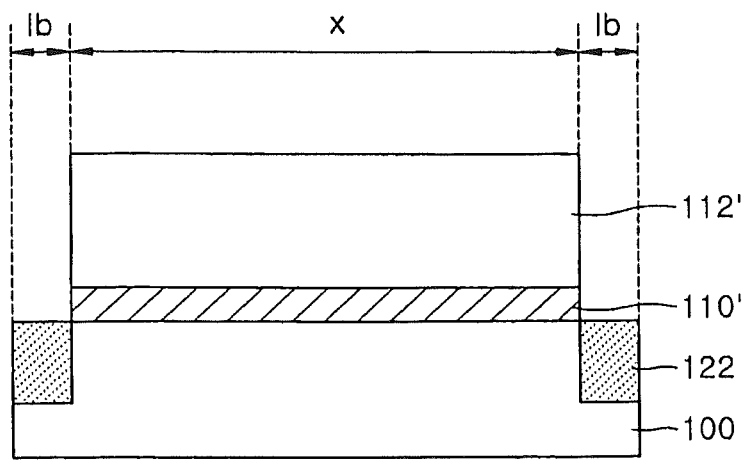
Figure 8C:
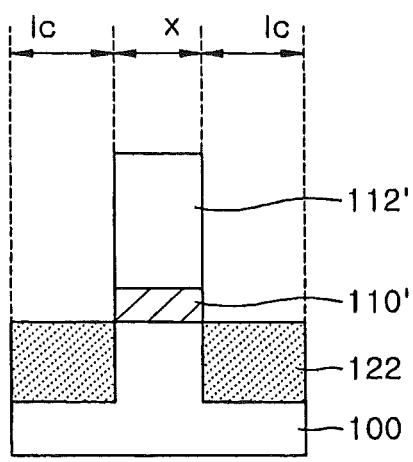

FIG. 8A is a perspective view of a structure obtained by removing the pad oxide layer pattern 114' and the nitride layer pattern 116' from the structure of FIGS. 7A, 7B, and 7C and recessing the isolation layer 120 in the structure of FIGS. 7A, 7B, and 7C. FIG. 8B is a cross-sectional view taken along line 8b-8b of FIG. 8A. FIG. 8C is a cross-sectional view taken along line 8c-8c of FIG. 8A. Referring to FIGS. 8A through 8C, the nitride layer pattern 116' and the pad oxide layer pattern 114' are removed, for example, through planarization (e.g., chemical mechanical polishing (CMP)) so that only the active layer pattern 112' and the sacrificial layer pattern 110' remain in the active region X on the semiconductor wafer 100. Thereafter, a second photoresist pattern (not shown) may be formed covering the active region X. A recessed isolation layer 122 may then be formed, for example, by anisotropically dry-etching the isolation layer 120 using the second photoresist pattern as an etching mask until sidewalls of the active layer pattern 112' and the sacrificial layer pattern 110' are exposed. The second photoresist pattern may then be removed.

Figure 9A:
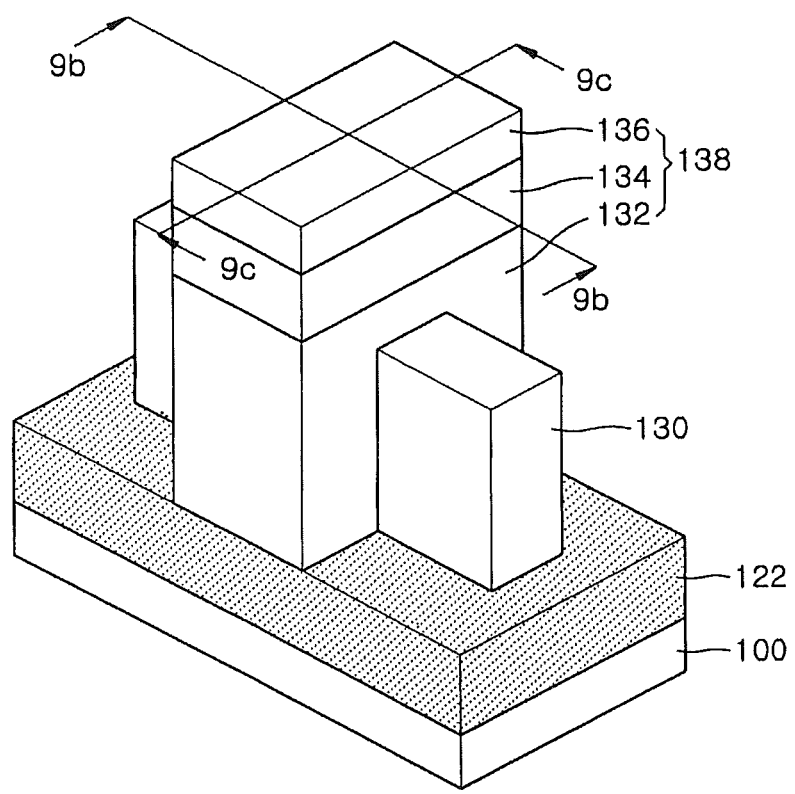
Figure 9B:
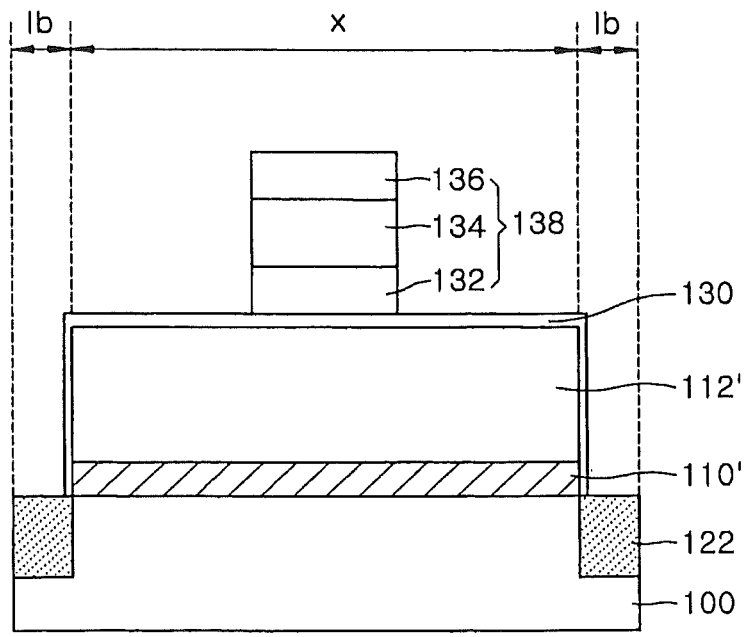
Figure 9C:
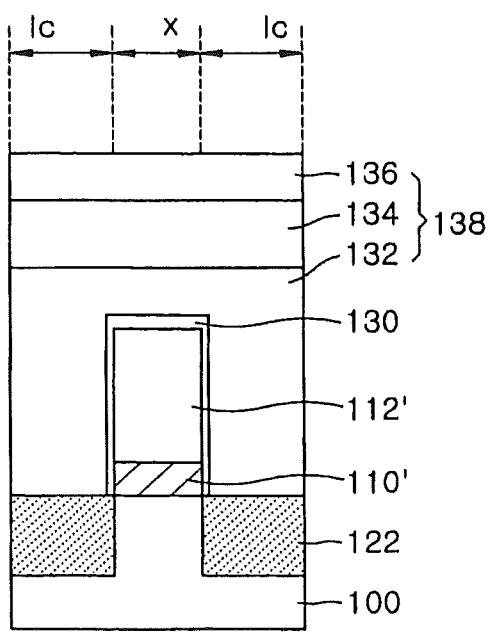

FIG. 9A is a perspective view illustrating a structure obtained by forming a gate insulation layer 130 and a gate electrode pattern 138 on the structure of FIGS. 8A, 8B, and 8C. FIG. 9B is a cross-sectional view taken along line 9b-9b of FIG. 9A. FIG. 9C is a cross-sectional view taken along line 9c-9c of FIG. 9A. As shown in the embodiments of FIGS. 9A through 9C, the gate insulation layer 130 is formed covering not only the sidewalls of the sacrificial layer pattern 110' and the active layer pattern 112' but also the top surface of the active layer pattern 112'. The gate insulation layer 130 may be a thermal oxide layer and/or an insulation layer with high dielectricity (e.g., an oxide layer, an oxide-nitride-oxide (ONO) layer, and/or a structure between an uppermost gate and channel of a non-volatile memory). The illustrated embodiments of FIGS. 9A-9C may be applied, for example, to a fin-shaped non-volatile memory device.

The gate electrode pattern 138 may then be formed by sequentially depositing a gate conductive layer pattern 132, a metal silicide layer pattern 134, and a capping layer pattern 136 on the gate insulation layer 130. The gate electrode pattern 138 may be formed in the middle of the active region X to a predetermined width. The gate electrode pattern 138 may be formed to cover the top surface of the recessed isolation layer 122 and the sidewalls of the active layer pattern 112' and the sacrificial layer pattern 110'. The gate conductive layer pattern 132 may be composed of a single layer or multiple layers formed of amorphous polysilicon, doped polysilicon, poly-SiGe, a conductive metal and/or a conductive metal-based material. In some embodiments, the gate conductive layer pattern 132 is composed of at least one layer of a conductive material, such as tungsten and/or molybdenum, and/or is composed of at least one layer of a conductive metal-based nitride, such as titanium nitride, tantalum nitride, and/or tungsten nitride. Depending on how the sacrificial layer pattern 110' is removed, the gate electrode pattern 138 may be formed as a dummy gate pattern, in which case, the gate electrode pattern 138 may be replaced with another gate material in a subsequent process.

Figure 10A:
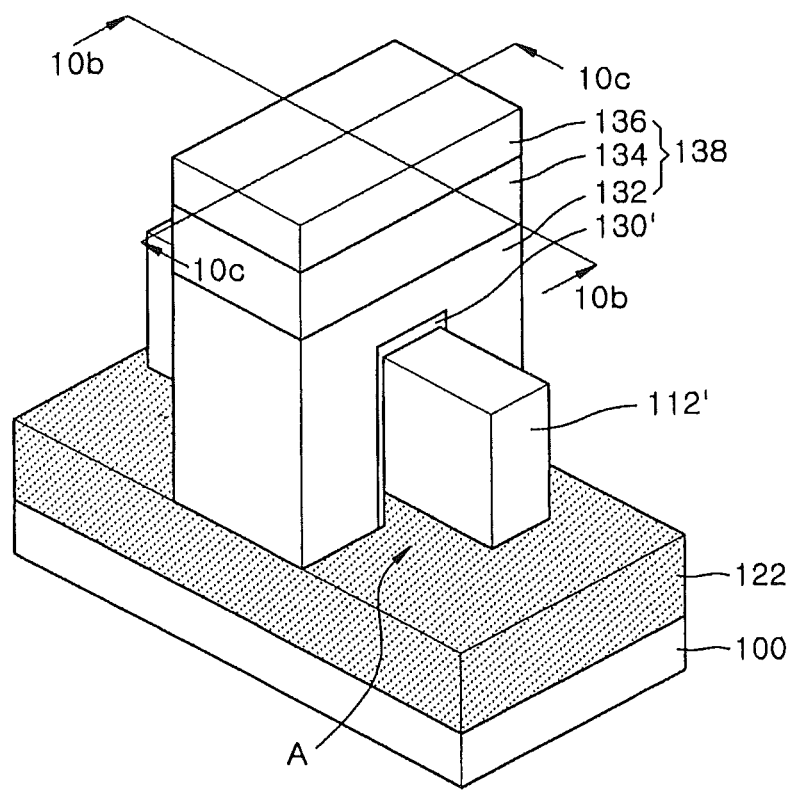
Figure 10B:
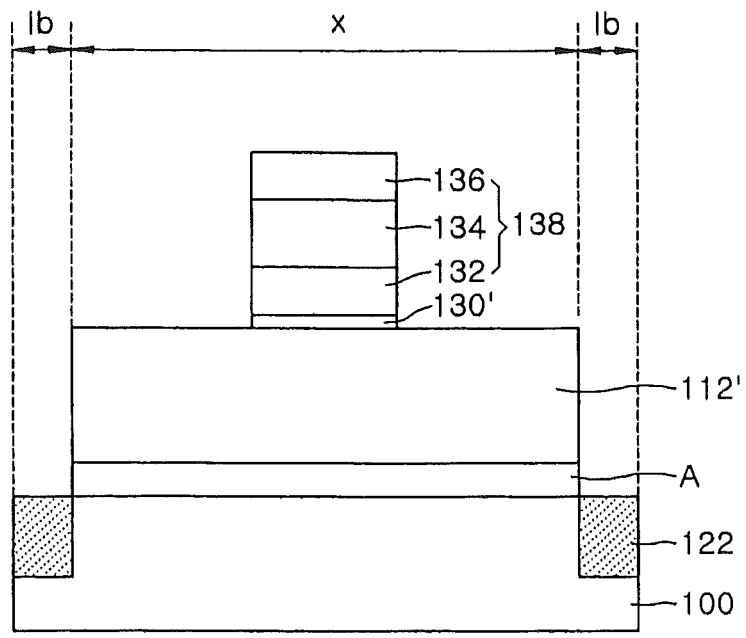
Figure 10C:
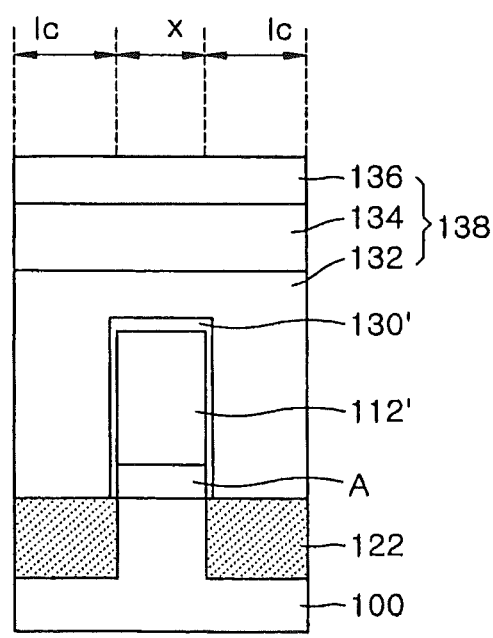

FIG. 10A is a perspective view illustrating a structure obtained by removing the sacrificial layer pattern 110' from the structure of FIGS. 9A, 9B, and 9C. FIG. 10B is a cross-sectional view taken along line 10b-10b of FIG. 10A. FIG. 10C is a cross-sectional view taken along line 10c-10c of FIG. 10A. Referring to the embodiments of FIGS. 10A through 10C, the sidewalls of the sacrificial layer pattern 110' and the active layer pattern 112' are exposed by removing the gate insulation layer 130 except for a portion of the gate insulation layer 130 located under (or masked by) the gate electrode pattern 138. When removing the gate insulation layer 130, diluted HF, $NH_4F$, and/or a buffered oxide etchant (BOE), which is composed of HF and deionized water, may be used. The portion of the gate insulation layer 130 remained under the gate electrode pattern 138 forms a gate insulation layer pattern 130'.

A void A may then be formed between the semiconductor wafer 100 and the active layer pattern 112' by removing the sacrificial layer pattern 110'. When removing the sacrificial layer pattern 110', the gate electrode pattern 138 may serve as a supporting layer to limit collapsing of the gate insulation layer pattern 130' and the active layer pattern 112'.

The sacrificial layer pattern 110' may be removed, for example, through wet etching and/or dry etching. When removing the sacrificial layer pattern 110', an etching process may be performed under the condition that the etching selectivity of the sacrificial layer pattern 110' with respect to the semiconductor wafer 100 and the active layer pattern 112' reaches 300 or higher. For example, assuming that the semiconductor wafer 100, the active layer pattern 112', and the sacrificial layer pattern 110' are, respectively, a silicon wafer, an epitaxial Si layer, and an epitaxial SiGe layer, the sacrificial layer pattern 110' may be removed through isotropic dry etching by using, for example, peracetic acid and a mixture of $H_2O_2$, HF, and/or $CH_3COOH$ as an etchant.

Figure 11A:
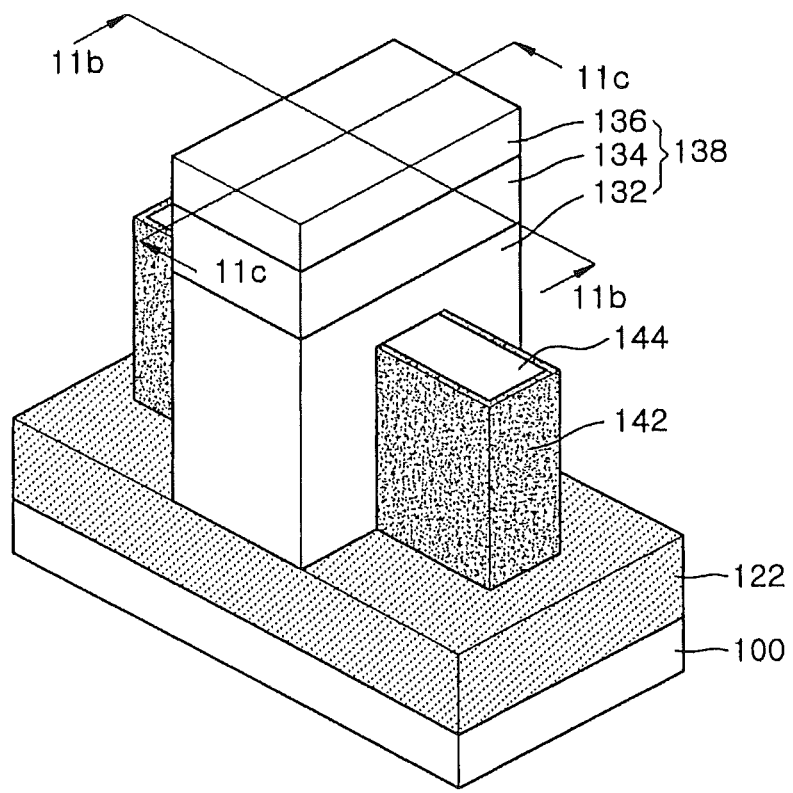
Figure 11B:
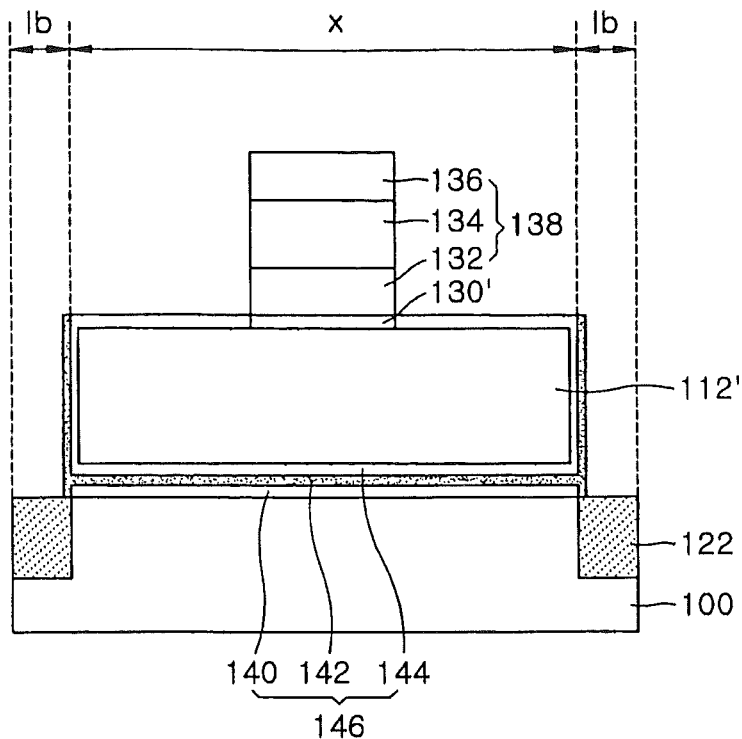
Figure 11C:
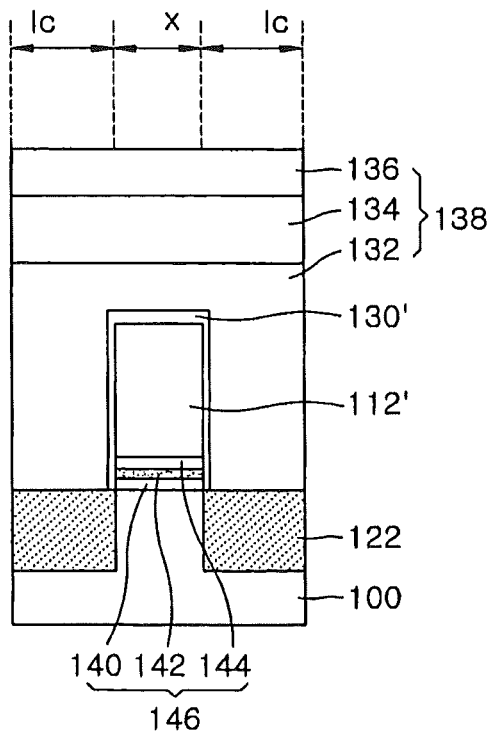

FIG. 11A is a perspective view illustrating a structure obtained by filling the void A in the structure of FIGS. 10A, 10B, and 10C with a gap-filling insulation layer 146 (FIGS. 11B and 11C). FIG. 11B is a cross-sectional view taken along line 11b-11b of FIG. 11A. FIG. 11C is a cross-sectional view taken along line 11c-11c of FIG. 11A. Referring to FIGS. 11A through 11C, the gap-filling insulation layer 146 is formed to fill the void A with the gap-filling insulation layer 146. The gap-filling insulation layer 146 may be at least one of an oxide layer, a nitride layer, and/or a silicon layer.

For example, assuming that the gap-filling insulation layer 146 is an ONO layer, first and second oxide layers 140 and 144 may be formed through thermal oxidation. A nitride layer 142 may be formed using a conventional deposition method, such as CVD, SACVD, LPCVD, and/or PECVD. Accordingly, an SOI wafer, which includes the semiconductor wafer 100, the gap-filling insulation layer 146, and the active layer pattern 112', may be formed.

When forming the second oxide layer 144, a lower portion of the active layer pattern 112' and part of the semiconductor wafer 100 may be eroded such that the thicknesses of the active layer pattern 112' and the semiconductor wafer 100 decrease. If the active layer pattern 112' is thicker than it should be, the thickness of the active layer pattern 112' can be reduced by repeatedly performing processes of forming an oxide layer through thermal oxidization and removing the oxide layer. As a result of forming the second oxide layer 144, either end of the gate insulation layer pattern 130' may be thicker than a central portion of the gate insulation layer pattern 130', which may result in an improved electric reliability of the gate insulation layer pattern 130'.

Figure 12A:
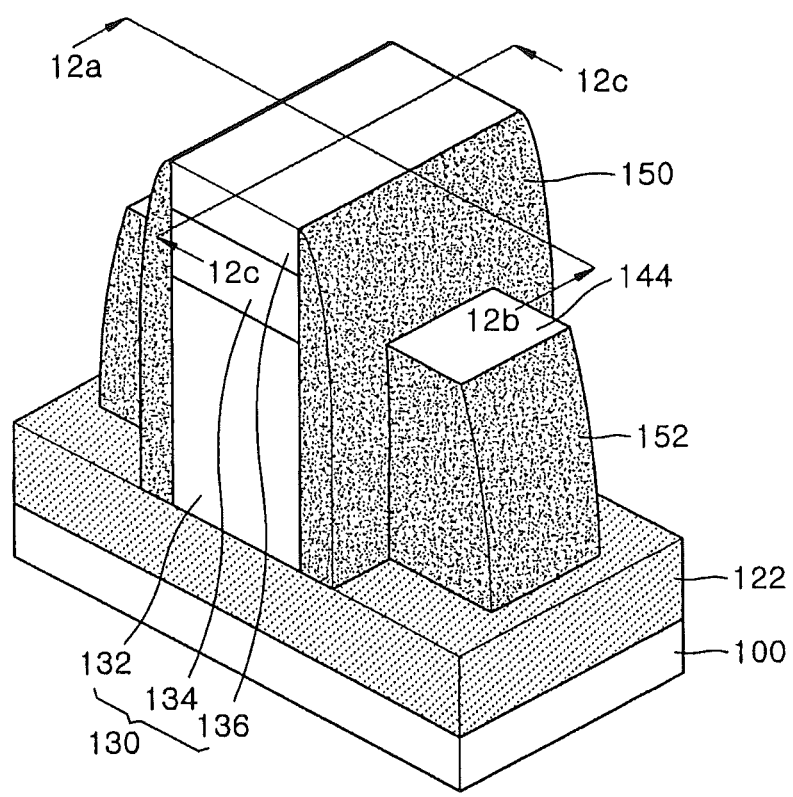
Figure 12B:
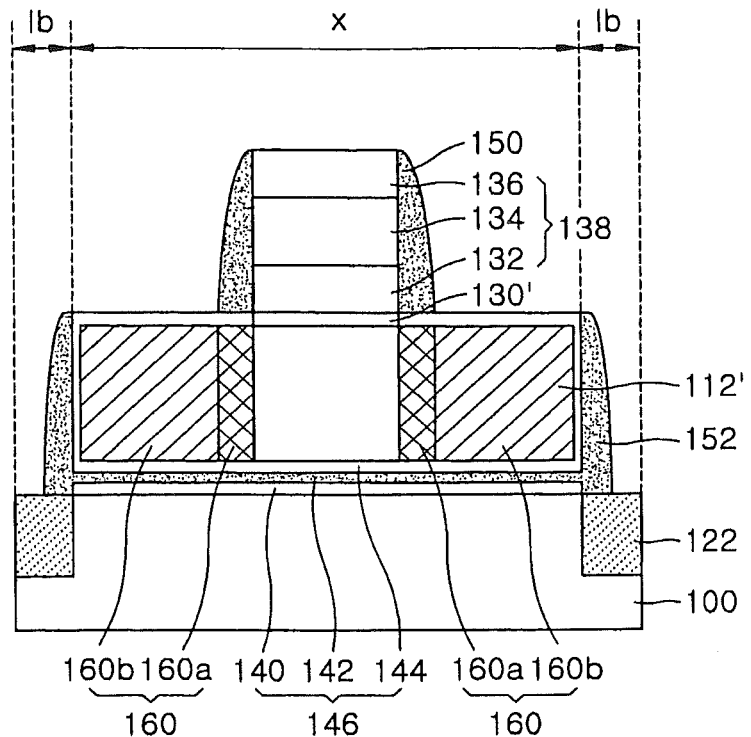
Figure 12C:
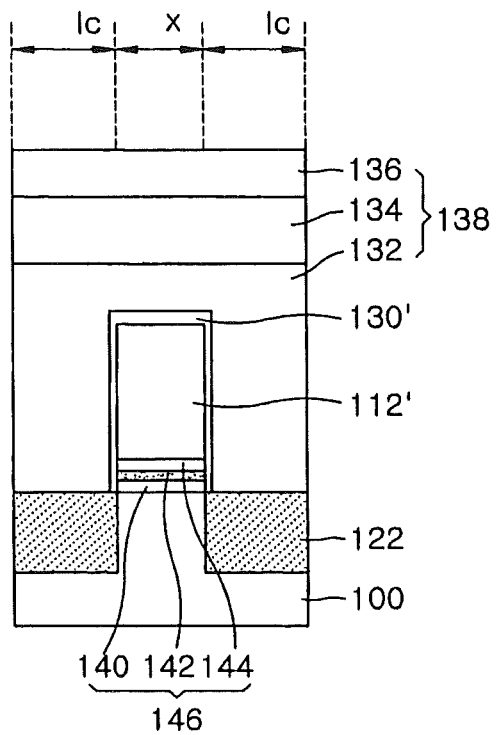

FIG. 12A is a perspective view illustrating a semiconductor device obtained by forming impurity regions in the structure of FIGS. 11A, 11B, and 11C. FIG. 12B is a cross-sectional view taken along line 12b-12b of FIG. 12A. FIG. 12C is a cross-sectional view taken along line 12c-12c of FIG. 12A. Referring to FIGS. 12A through 12C, a lightly doped drain (LDD) 160a (or a source/drain extension (SDE) impurity layer) is formed in the active layer pattern 112' at either side of the gate electrode pattern 138 by implanting or diffusing first source/drain impurity ions into the active layer pattern 112' at either side of the gate electrode pattern 138 using the gate electrode pattern 138 as a mask.

First spacers 150 are then formed at either sidewall of the gate electrode pattern 138 and a highly doped drain (HDD) impurity layer 160b is formed by implanting or diffusing second source/drain impurity ions into the active layer pattern 112' using the gate electrode pattern 138 and the first spacers 150 as ion implantation masks. The second source/drain impurity ions have the same conductivity type as the first source/drain impurity ions. The LDD and HDD impurity layers 160a and 160b correspond to a source/drain region 160 at each side of the gate electrode pattern 138. The source/drain region(s) 160 may include the LDD impurity layer 160a and second spacers 152 may be formed on the sidewalls of the active layer pattern 112' and the gap-filling insulation layer 146 and on the recessed isolation layer 122. The second spacers 152 may serve as liners limiting or preventing damage to the recessed isolation layer 122 caused by a subsequent heat treatment process.

As described above, a bulk silicon device may be formed in an area obtained by removing the sacrificial layer 110 from the structure of FIGS. 5A, 5B, and 5C. In addition, an SOI wafer may be formed by filling the sacrificial layer pattern 110' with the gap-filling insulation layer 146. Therefore, it is possible to form a bulk silicon device and an SOI device together on the semiconductor wafer 100. In other words, it is possible to form a semiconductor device in a predetermined area on an SOT wafer. In addition, when the active layer 112 is formed to be thicker than desired, the thickness of the active layer 112 can be reduced by repeatedly performing processes of forming an oxide layer on the active layer 112 through thermal oxidation and then removing the oxide layer.

FIGS. 13A through 16C are diagrams illustrating methods of manufacturing a semiconductor device according to further embodiments of the present invention. The embodiments of FIGS. 13A through 16C will be described with reference to a fin-shaped dual gate semiconductor device for purposes of explanation herein. The embodiments of FIGS. 13A through 16C correspond to the previously described embodiments with respect to recessing an isolation layer and forming a sacrificial layer pattern and an active layer pattern, and, thus, detailed descriptions of the common aspects of these embodiments will not be repeated herein.

Figure 13A:
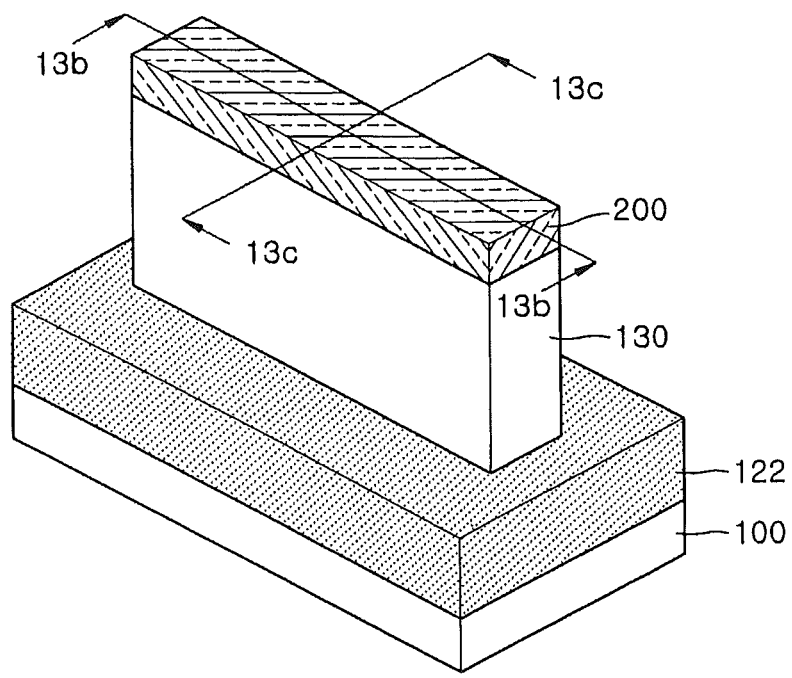
FIGS. 13A through 16C are cross-sectional or perspective views illustrating methods of manufacturing a semiconductor device according to further embodiments of the present invention.
Figure 13B:
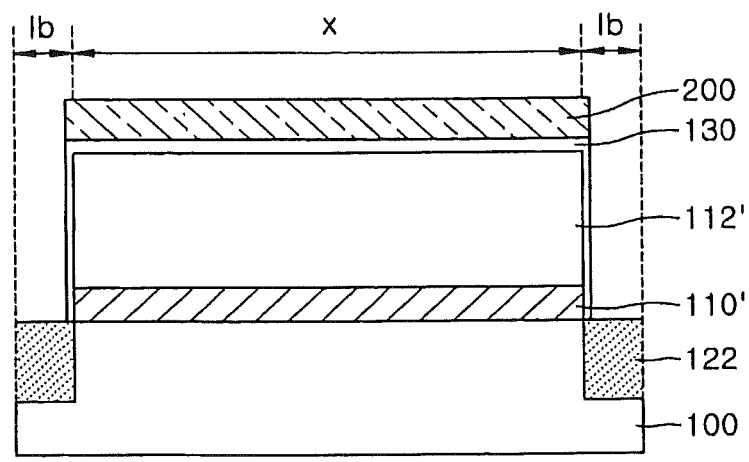
Figure 13C:
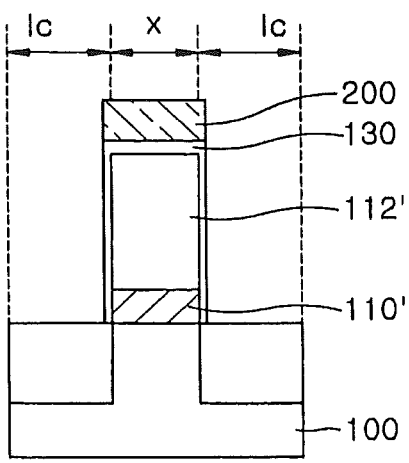

FIG. 13A is a perspective view illustrating a structure obtained by forming a gate insulation layer 130 and a first hard mask layer 200 on a semiconductor wafer 100. FIG. 13B is a cross-sectional view taken along line 13b-13b of FIG. 13A. FIG. 13C is a cross-sectional view taken along line 13c-13c of FIG. 13A. Referring to FIGS. 13A through 13C, the gate insulation layer 130 is formed to cover a sacrificial layer pattern 110' and an active layer pattern 112', which have already been formed on the semiconductor wafer 100. The gate insulation layer 130 may be, for example, a thermal oxide layer and/or an insulation layer with high dielectricity (e.g., an oxide layer, an oxide-nitride-oxide (ONO) layer, and/or a structure between an uppermost gate and channel of a non-volatile memory). In other words, the embodiments of FIGS. 13A through 16C can be applied, for example, to a fin-shaped non-volatile memory.

The first hard mask layer 200 is formed to cover the top surface of the gate insulation layer 130. The first hard mask layer 200 may be an insulation layer (e.g., a nitride layer).

Figure 14A:
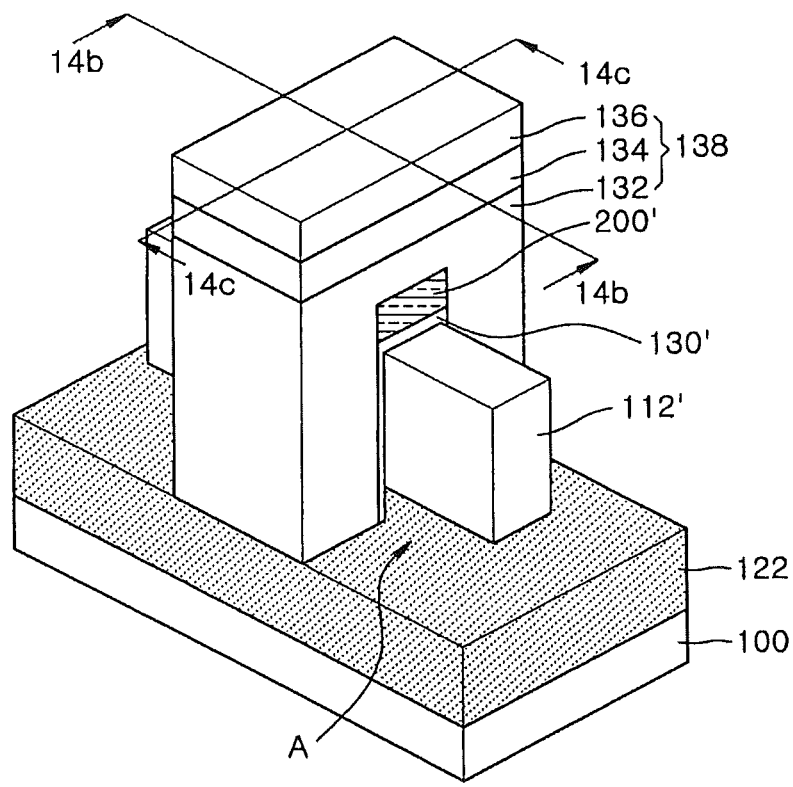
Figure 14B:
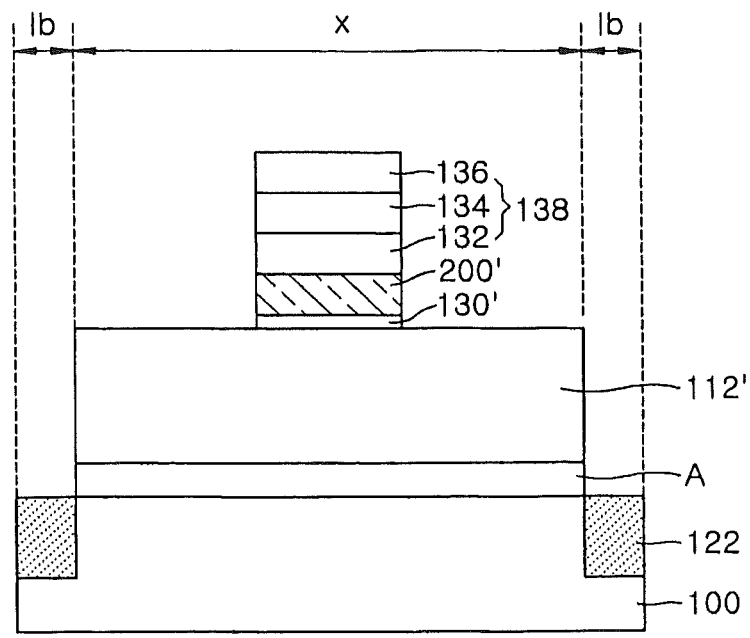
Figure 14C:
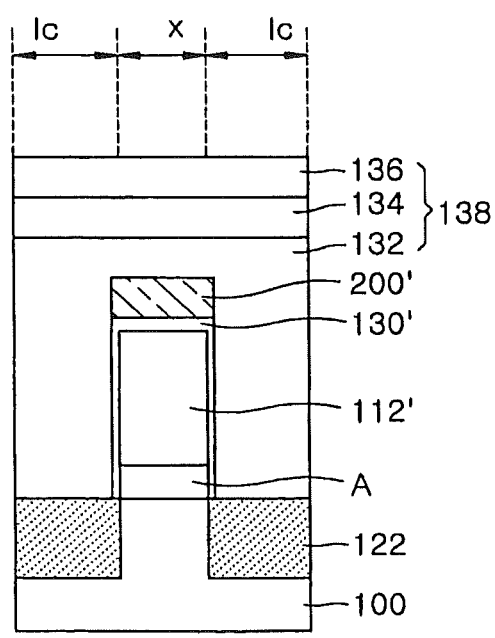

FIG. 14A is a perspective view illustrating a structure obtained by forming a gate electrode pattern 138 on the structure of FIGS. 13A, 13B, and 13C and then removing the sacrificial layer pattern 110' from the structure of FIGS. 13A, 13B, and 13C. FIG. 14B is a cross-sectional view taken along line 14b-14b of FIG. 14A. FIG. 14C is a cross-sectional view taken along line 14c-14c of FIG. 14A. Referring to FIGS. 14A through 14C, a first hard mask pattern 200' is formed by partially etching the hard mask layer 200 on the gate insulation layer 130. The sidewalls of the first hard mask pattern 200' may be aligned with the sidewalls of the active layer pattern 112' and the sacrificial layer pattern 110'.

A gate conductive layer pattern 132 is formed to cover the top surfaces and sidewalls of the first hard mask pattern 200', the active layer pattern 112', and the sacrificial layer pattern 110'. A metal silicide layer pattern 134 and a capping layer pattern 136 may be sequentially formed on the gate conductive layer pattern 132. A sequential stack of the gate conductive layer pattern 132, the metal silicide layer pattern 134, and the capping layer pattern 136 defines the gate electrode pattern 138. The gate electrode pattern 138 may be formed in the middle of an active region X to a predetermined width. The gate conductive layer pattern 132 may be a single layer or multiple layers formed of amorphous polysilicon, doped polysilicon, poly-SiGe, a conductive metal and/or a conductive metal-based material. In some embodiments, the gate conductive layer pattern 132 is at least one layer of a conductive material as tungsten and/or molybdenum and/or is at least one layer of a conductive metal-based nitride, such as titanium nitride, tantalum nitride, and/or tungsten nitride. Depending on how the sacrificial layer pattern 110' is removed, the gate electrode pattern 138 may be formed as a dummy gate pattern, in which case, the gate electrode pattern 138 may be replaced with another gate material in a subsequent process.

The sidewalls of the sacrificial layer pattern 110' and the active layer pattern 112' may then be exposed by removing the gate insulation layer 130 with the exception of portions of the gate insulation layer 130 masked by the gate electrode pattern 138. When removing the gate insulation layer 130, diluted HF, NH4F, and/or a BOE, which is composed of HF and deionized water, may be used. The portions of the gate insulation layer 130 masked by the gate electrode pattern 138 define a gate insulation layer pattern 130'.

A void A is formed between the semiconductor wafer 100 and the active layer pattern 112' by removing the sacrificial layer pattern 110'. When removing the sacrificial layer pattern 110', the gate electrode pattern 138 may serve as a supporting layer, which limits or prevents collapsing of the gate insulation layer pattern 130' and the active layer pattern 112'.

Figure 15A:
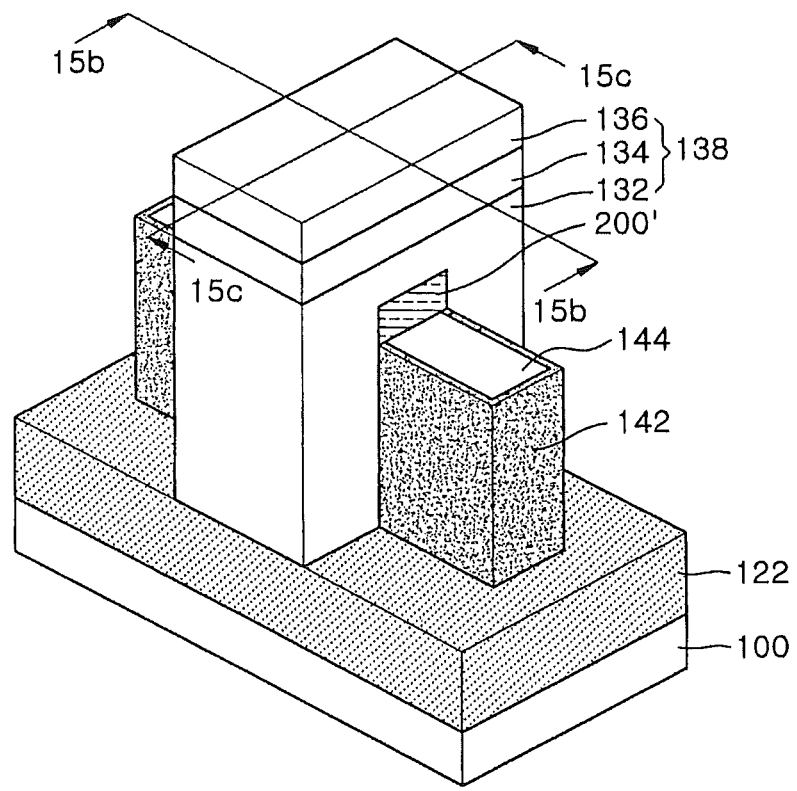
Figure 15B:
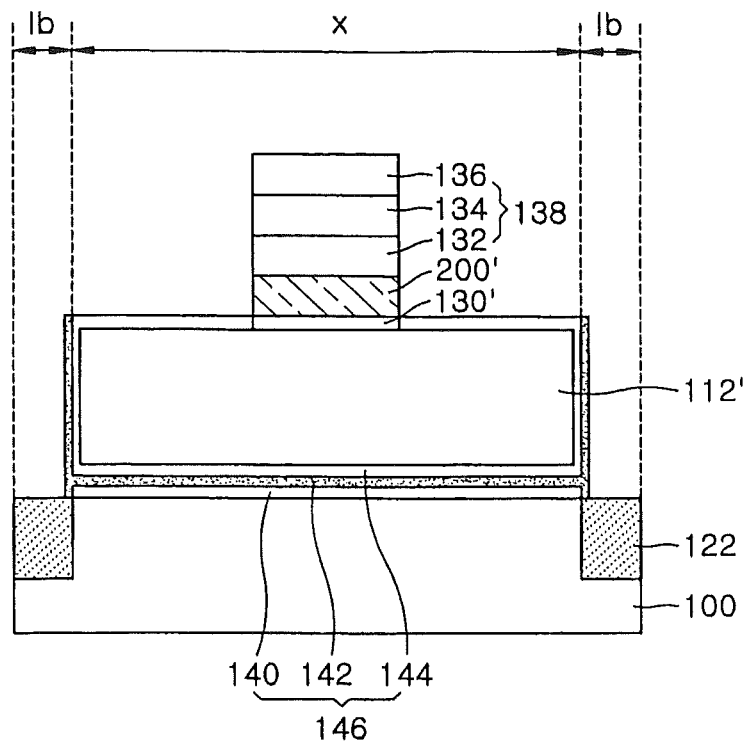
Figure 15C:
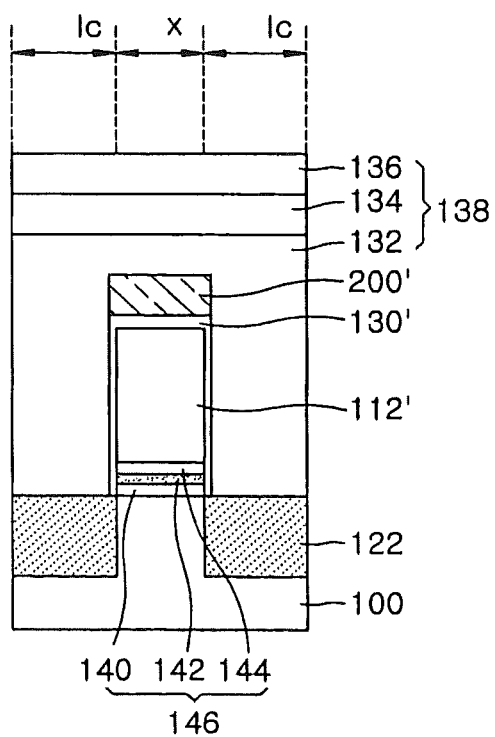

FIG. 15A is a perspective view illustrating a structure obtained by filling the void A in the structure of FIGS. 14A, 14B, and 14C with a gap-filling insulation layer 146. FIG. 15B is a cross-sectional view taken along line 15b-15b of FIG. 15A. FIG. 15C is a cross-sectional view taken along line 15c-15c of FIG. 15A. Referring to FIGS. 15A through 15C, the gap-filling insulation layer 146 is formed so that the void A can be filled with the gap-filling insulation layer 146. The gap-filling insulation layer 146 may be at least one of an oxide layer, a nitride layer, and/or a silicon layer.

For example, assuming the gap-filling insulation layer 146 is an ONO layer, first and second oxide layers 140 and 144 may be formed through thermal oxidation and a nitride layer 142 may be formed by using a conventional deposition method, such as CVD, SACVD, LPCVD, or PECVD. Accordingly, an SOI wafer, which includes the semiconductor wafer 100, the gap-filling insulation layer 146, and the active layer pattern 112', may be formed.

When forming the second oxide layer 144, a lower portion of the active layer pattern 112' and part of the semiconductor wafer 100 may be eroded so that the thicknesses of the active layer pattern 112' and the semiconductor wafer 100 decrease. If the active layer pattern 112' is formed to be thicker than desired, the thickness of the active layer pattern 112' can be reduced by repeatedly performing processes of forming an oxide layer through thermal oxidation and removing the oxide layer.

Figure 16A:
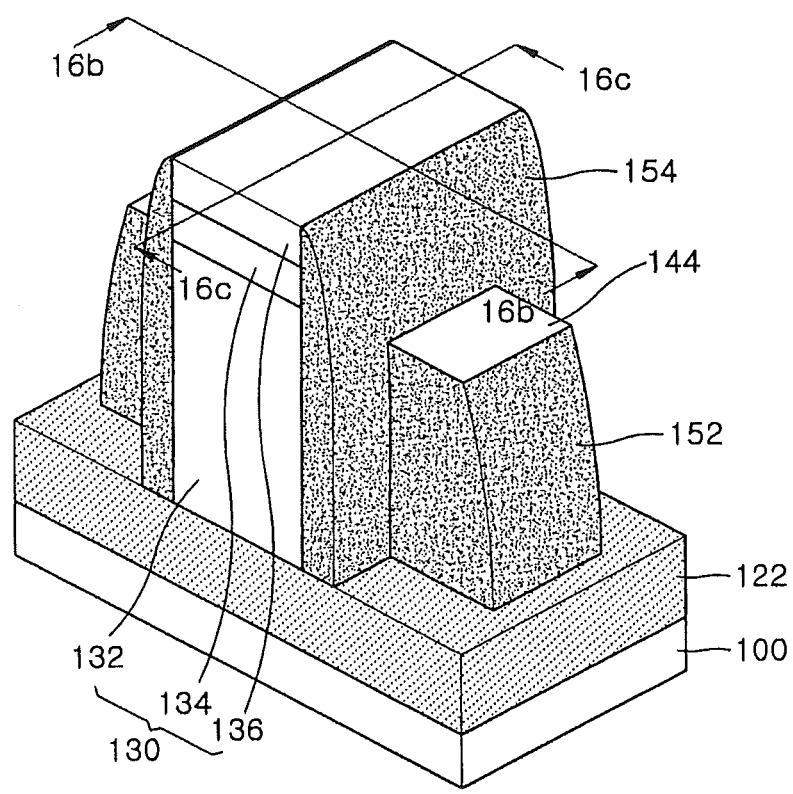
Figure 16B:
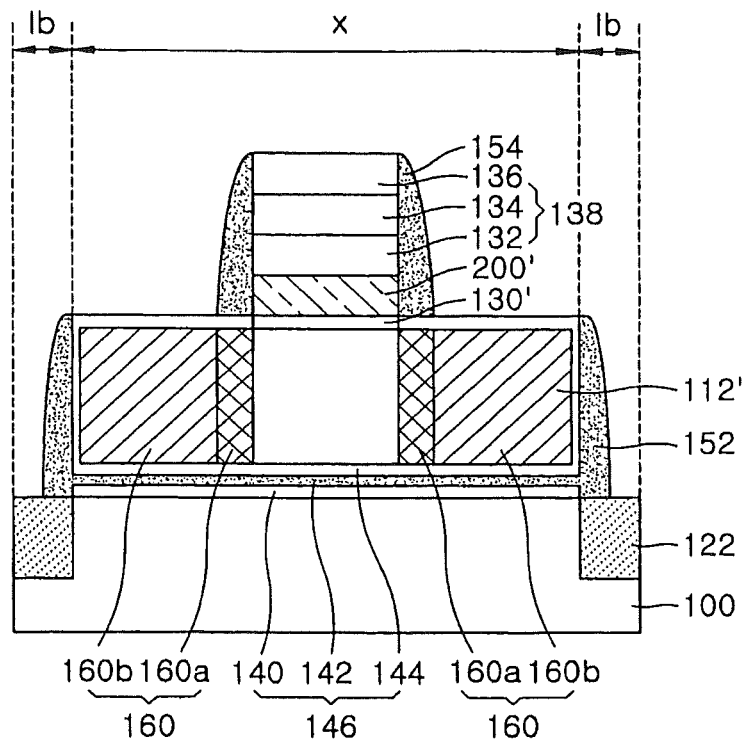
Figure 16C:
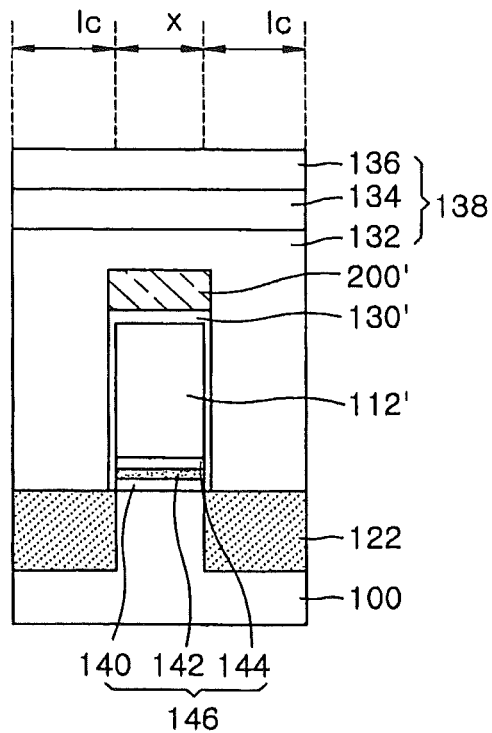

FIG. 16A is a perspective view illustrating a semiconductor device obtained by forming impurity regions in the structure of FIGS. 15A, 15B, and 15C. FIG. 16B is a cross-sectional view taken along line 16b-16b of FIG. 16A. FIG. 16C is a cross-sectional view taken along line 16c-16c of FIG. 16A. Referring to FIGS. 16A through 16C, a lightly doped drain (LDD) impurity layer 160a (or a source/drain extension (SDE) impurity layer) is formed in the active layer pattern 112' at either side of the gate electrode pattern 138, for example, by implanting or diffusing first source/drain impurity ions into the active layer pattern 112' at either side of the gate electrode pattern 138 using the gate electrode pattern 138 as a mask.

Third spacers 154 are formed, for example, of nitride, on the sidewalls of the first hard mask pattern 200' and the gate pattern 138, and second spacers 152 are formed, for example, of nitride, on the sidewalls of the active layer pattern 112' and the gap-filling insulation layer 146 and on the recessed isolation layer 122. Source and drain regions 160a and 160b are formed, for example, by implanting or diffusing impurities into portions of the active layer pattern 112' at either side of the gate electrode pattern 138 using the third spacers 154 as ion implantation masks. The second spacers 152 may serve as liners limiting or preventing damage to the recessed isolation layer 122 caused by a subsequent heat treatment process.

FIGS. 17 through 23 are diagrams illustrating methods of manufacturing a semiconductor device according to yet further embodiments of the present invention. The semiconductor device that will be described for purposes of enabling the embodiments of FIGS. 17 through 23 is a semiconductor device having a planar active region.

Figure 17A:
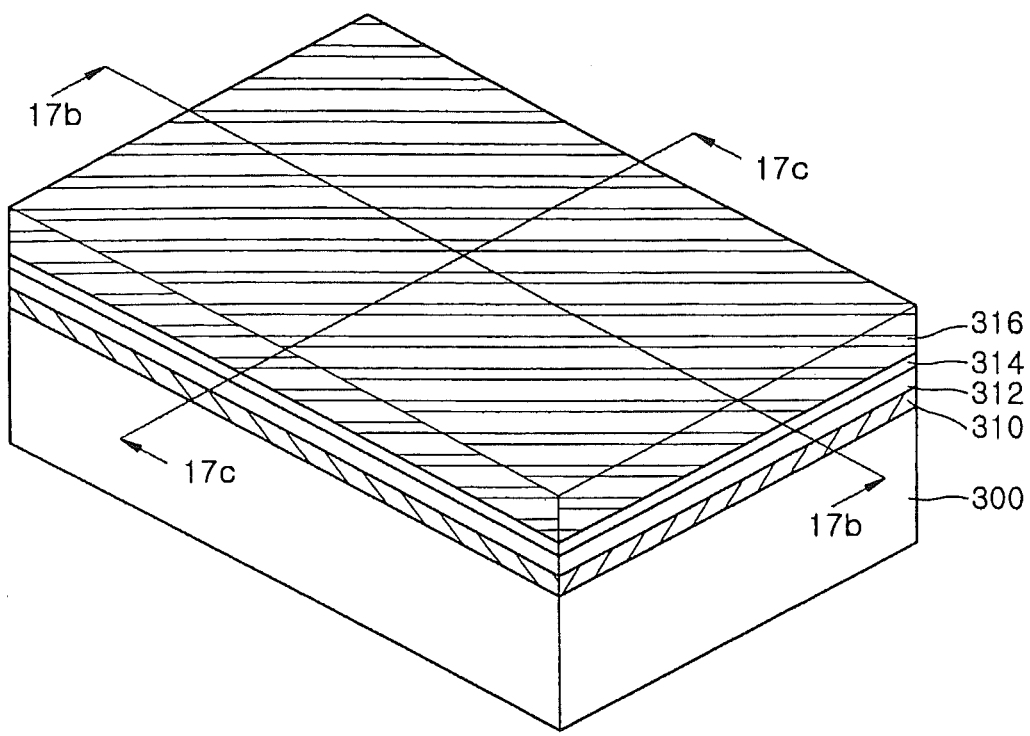
FIGS. 17A through 23C are cross-sectional or perspective views illustrating methods of manufacturing a semiconductor device according to other embodiments of the present invention.
Figure 17B:
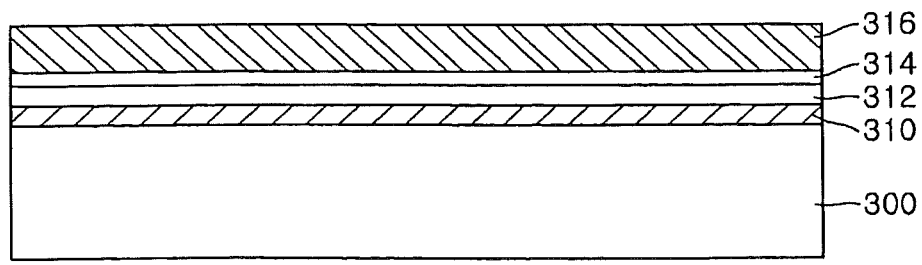
Figure 17C:
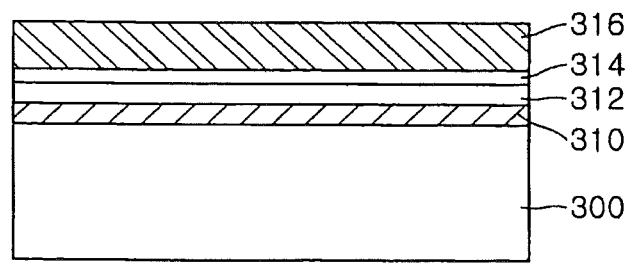

FIG. 17A is a perspective view illustrating a structure obtained by forming a sacrificial layer 310 and then an active layer 312 on a semiconductor wafer 300, FIG. 17B is a cross-sectional view taken along line 17b-17b of FIG. 17A. FIG. 17C is a cross-sectional view taken along line 17c-17c of FIG. 17A. Referring to FIGS. 17A through 17C, the sacrificial layer 310 and the active layer 312 may be sequentially formed, of the same materials as their respective counterparts described with reference to FIG. 5A, on the semiconductor wafer 300 (e.g., a silicon wafer). The sacrificial layer 310 and the active layer 312 may be formed through epitaxial growth, which may allow their thicknesses to be readily adjusted. The illustrated active layer 312 has a channel area that does not protrude as much as a channel area of the active layer 112 shown for the previously described embodiments and is, instead, substantially flat. The thickness of the active layer 312 in some embodiments is significantly smaller than the thickness of the active layer 112 in the previously described embodiments. A pad oxide layer 314 and a nitride layer 316 may be sequentially deposited on the active layer 312.

A bulk silicon device region can be formed by removing the sacrificial layer 310 from the structure of FIGS. 17A, 17B, and 17C. Also, an SOI device can be formed by forming a photoresist pattern in the bulk silicon device region to protect the bulk silicon device region and then performing subsequent processes. Therefore, in some embodiments of the present invention, both bulk silicon devices and SOI devices may be formed on the same semiconductor wafer 300.

Figure 18A:
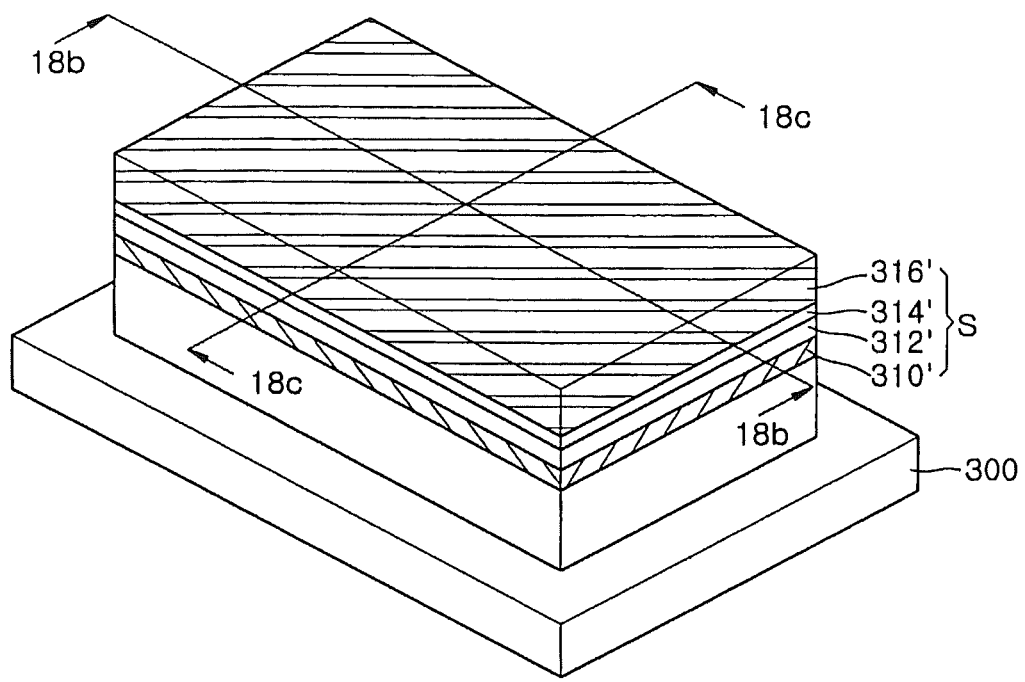
Figure 18B:
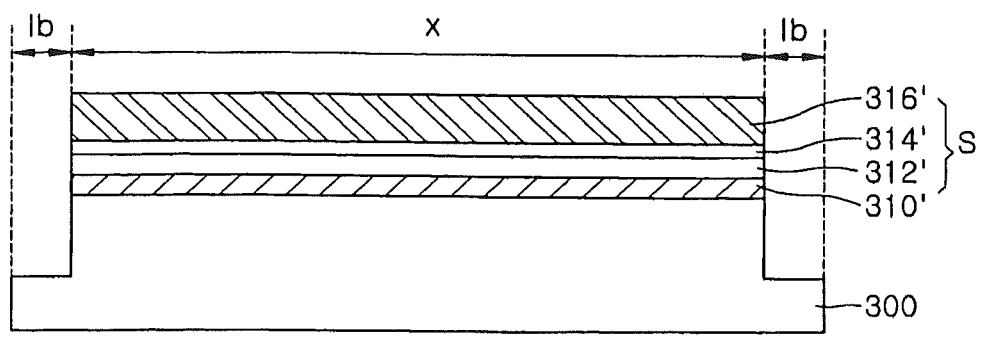
Figure 18C:
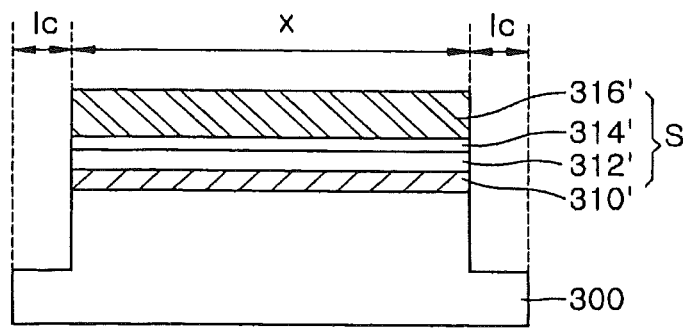

FIG. 18A is a perspective view illustrating a structure obtained by forming isolation regions Ib and Ic (FIGS. 18B and 18C) on the semiconductor wafer (substrate) 300. FIG. 18B is a cross-sectional view taken along line 18b-18b of FIG. 18A. FIG. 18C is a cross-sectional view taken along line 18c-18c of FIG. 18A. Referring to FIGS. 18A through 18C, a stack pattern S, which includes a nitride layer pattern 316', a pad oxide layer pattern 314', an active layer pattern 312', and a sacrificial layer pattern 310', is formed on the semiconductor wafer 300. Methods suitable for forming the stack pattern S have been described above with reference to FIGS. 6A through 6C. The isolation regions Ib and Ic, which are formed surrounding the active region X, are exposed on the semiconductor wafer 100 by the stack pattern S. The isolation regions Ib and Ic may be formed to a desired depth to achieve a desired isolation.

Figure 19A:
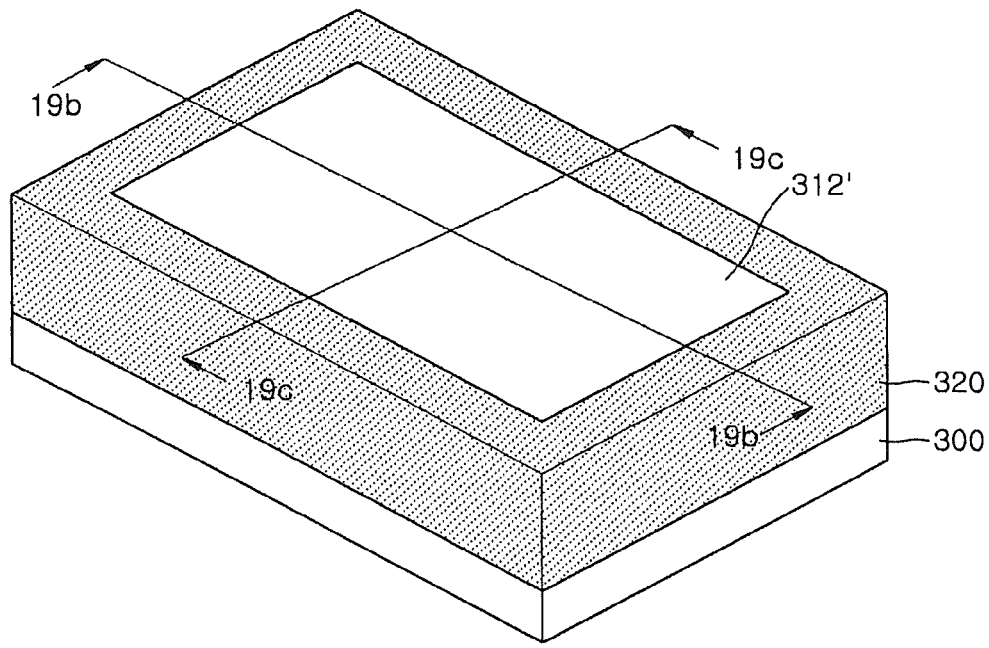
Figure 19B:
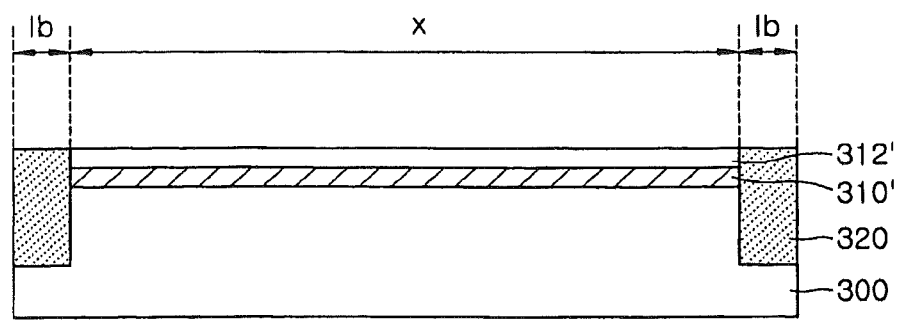
Figure 19C:
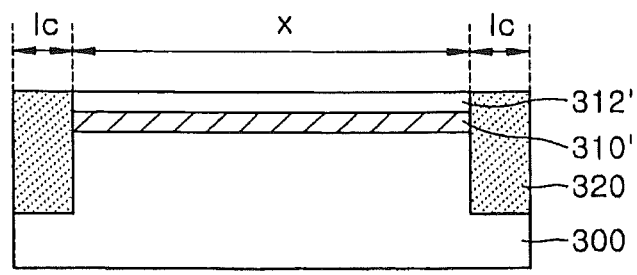

FIG. 19A is a perspective view illustrating a structure obtained by forming an isolation layer 320 on the structure of FIGS. 18A, 18B, and 18C. FIG. 19B is a cross-sectional view taken along line 19b-19b of FIG. 19A, FIG. 19C is a cross-sectional view taken along line 19c-19c of FIG. 19A. Referring to FIGS. 19A through 19C, the nitride layer pattern 316' and the pad oxide layer pattern 314' may be removed by a conventional method. Thereafter, the isolation layer 320 (e.g., an oxide layer) is illustrated as formed on the isolation regions Ib and Ic, for example, in the same manner described above with reference to FIGS. 7A through 7C, so that the sidewalls of the sacrificial layer pattern 310' and the active layer pattern 312' can be surrounded by the isolation layer 320. The top surface of the active layer pattern 312' may be substantially on the same level with the top surface of the isolation layer 320. The isolation layer 320 may be formed without removing the nitride layer pattern 316' and the pad oxide layer pattern 314', in which case, the resulting structure may be planarized.

Figure 20A:
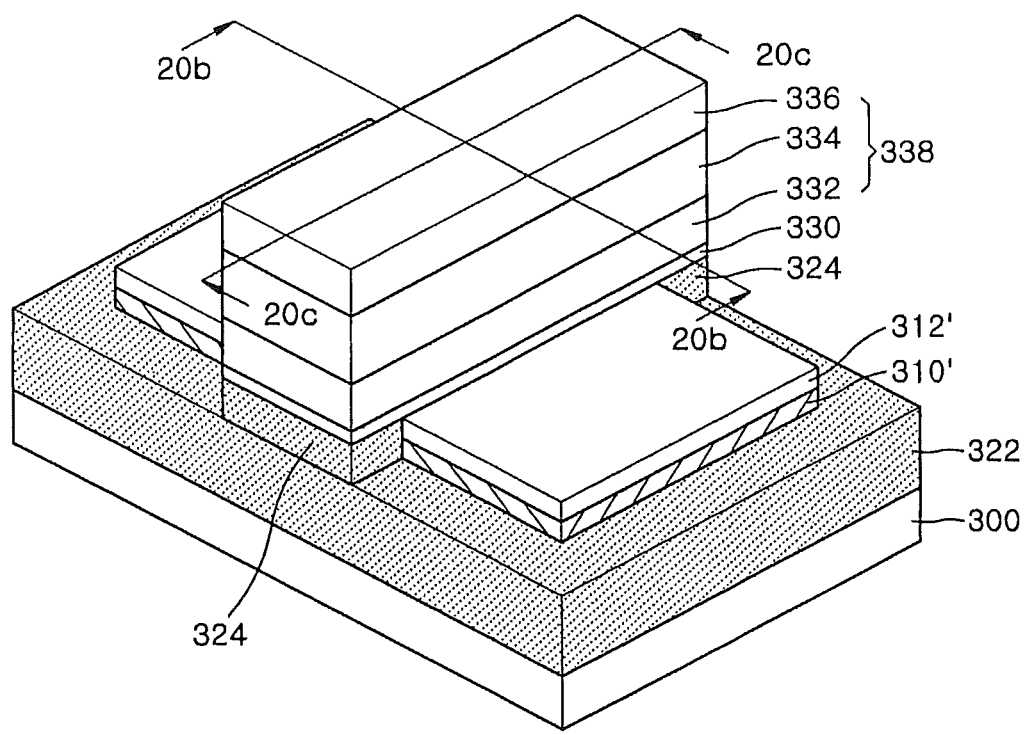
Figure 20B:
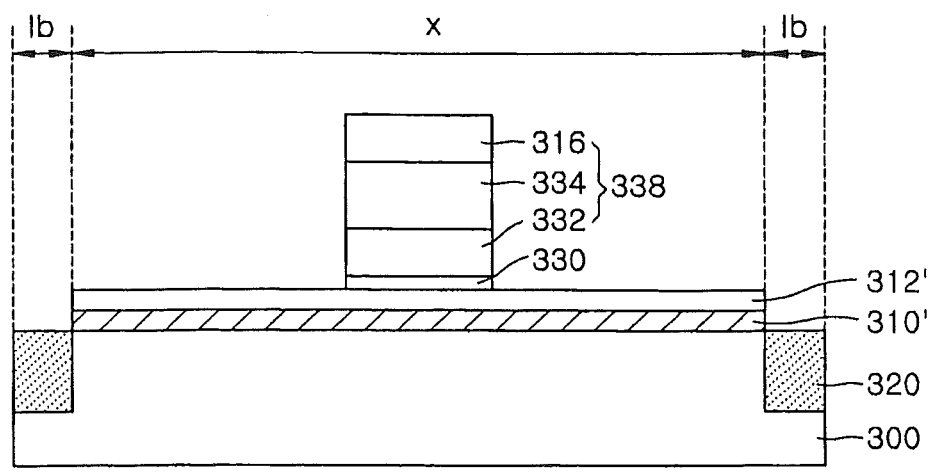
Figure 20C:
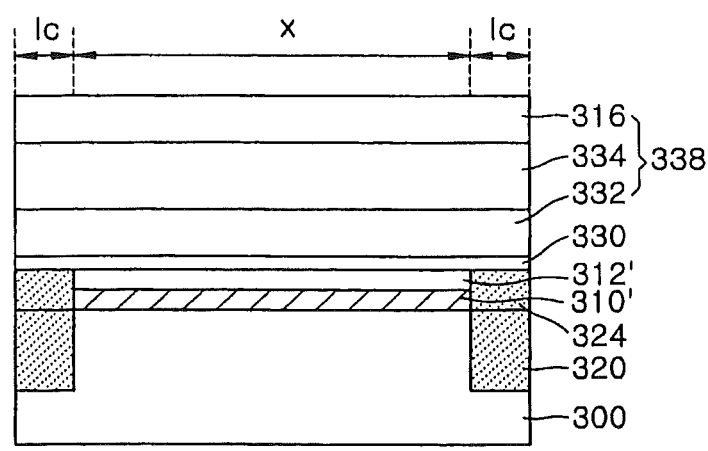

FIG. 20A is a perspective view illustrating a structure obtained by forming a gate electrode pattern 338 and a supporting isolation layer 324 on the structure of FIGS. 19A, 19B, and 19C. FIG. 20B is a cross-sectional view taken along line 20b-20b of FIG. 20A. FIG. 20C is a cross-sectional view taken along line 20c-20c of FIG. 20A. Referring to the embodiments of FIGS. 20A through 20C, a gate insulation layer (not shown) is formed on the isolation layer 320 and on the active layer pattern 312'. The gate insulation layer may be a thermal oxide layer and/or an insulation layer with high dielectricity (e.g., an oxide layer, an oxide-nitride-oxide (ONO) layer, and/or a structure between an uppermost gate and channel of a non-volatile memory). The illustrated embodiments of FIGS. 20A-20C may, for example, be used to manufacture a non-volatile memory device having a planar active region.

The gate electrode pattern 338 may be formed by sequentially depositing a gate conductive layer pattern 332, a metal silicide layer pattern 334, and a capping layer pattern 336 on the gate insulation layer. Depending on how the sacrificial layer pattern 310' is removed, the gate electrode pattern 338 may be formed as a dummy gate pattern, in which case, the gate electrode pattern 338 may be replaced with another gate material in a subsequent process.

A recessed isolation layer 322 and a supporting isolation layer 324, which is located under the gate electrode pattern 338, may be formed by etching the isolation layer 320 using the gate electrode pattern 338, the active layer pattern 312', and the sacrificial layer pattern 310' as etching masks. The recessed isolation layer 322 may be formed so that the sidewalls of the sacrificial layer pattern 310' can be exposed. As a result of the etching process, a gate insulation layer pattern 330 may be formed between the gate electrode pattern 338 and the supporting isolation layer 324 and between the gate electrode pattern 338 and the active layer pattern 312'.

Figure 21A:
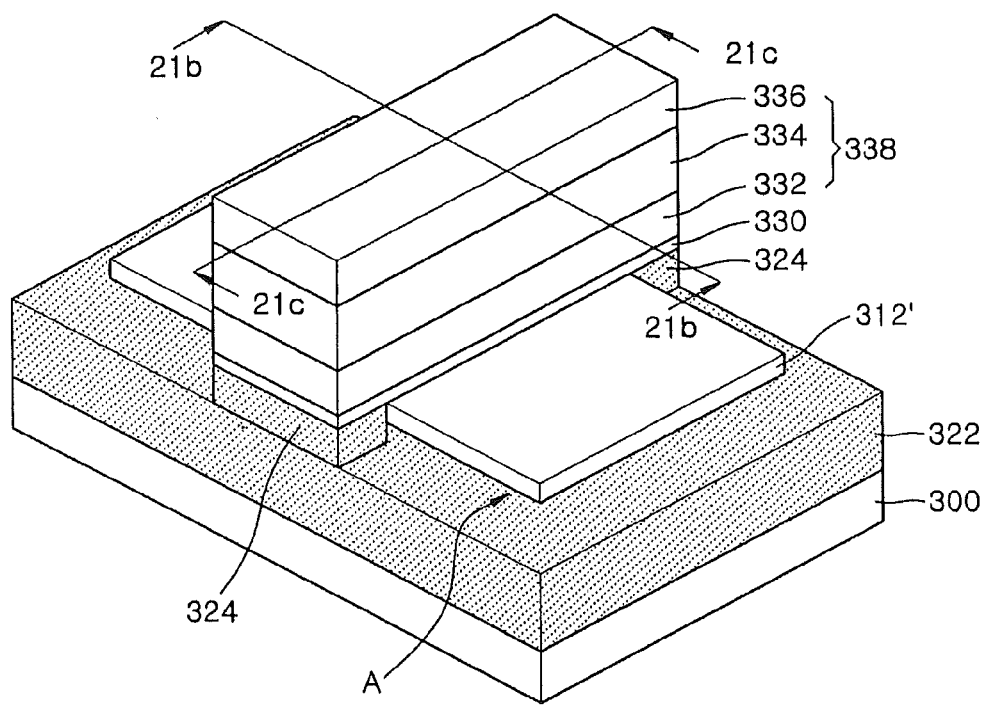
Figure 21B:
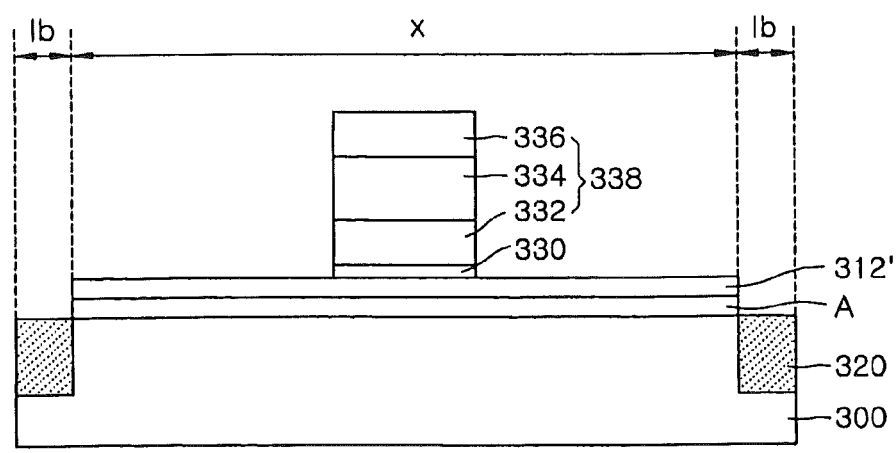
Figure 21C:
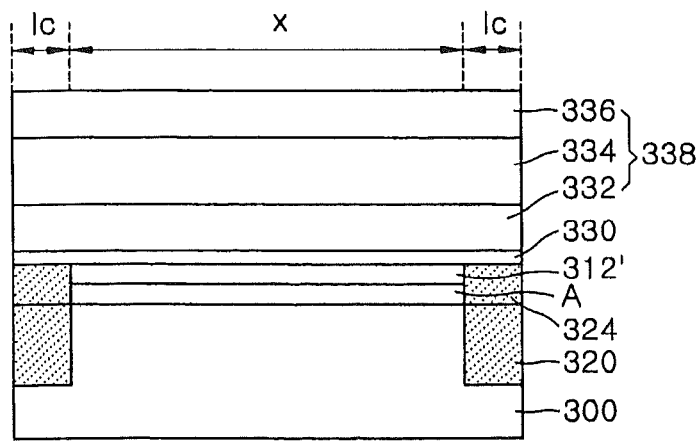

FIG. 21A is a perspective view illustrating a structure obtained by removing the sacrificial layer pattern 310' from the structure of FIGS. 20A, 20B, and 20C. FIG. 21B is a cross-sectional view taken along line 21b-21b of FIG. 21A. FIG. 21C is a cross-sectional view taken along line 21c-21c of FIG. 21A. Referring to the embodiments of FIGS. 21A through 21C, a void A is formed between the semiconductor wafer 300 and the active layer pattern 312' by removing the sacrificial layer pattern 310', for example, as described above with reference to FIGS. 10A through 10C. During the removal of the sacrificial layer pattern 310', the supporting isolation layer 324 may serve as a supporter limiting or preventing collapse of the gate insulation layer pattern 330 and the active layer pattern 312'.

Figure 22A:
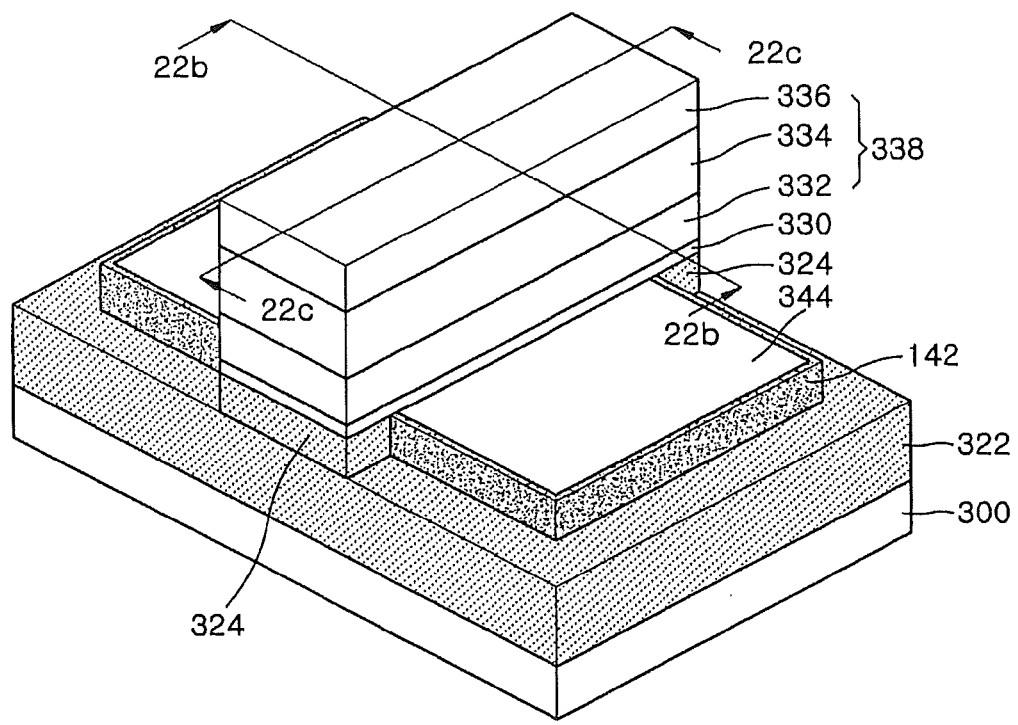
Figure 22B:
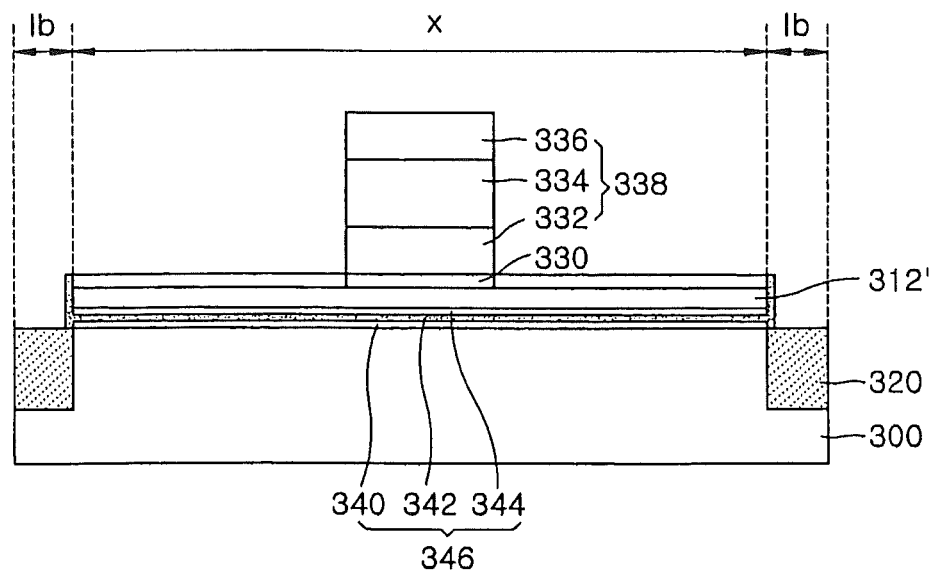
Figure 22C:
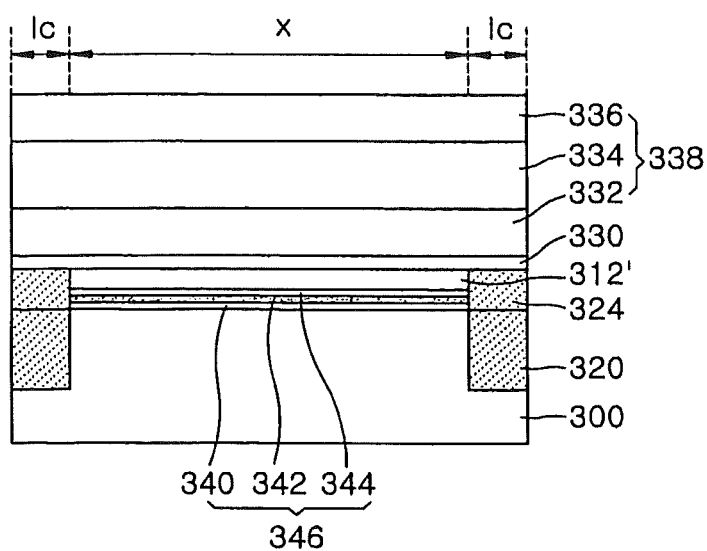

FIG. 22A is a perspective view illustrating a structure obtained by filling the void A in the structure of FIGS. 21A, 21B, and 21C with a gap-filling insulation layer 346 (FIGS. 22B and 22C). FIG. 22B is a cross-sectional view taken along line 22b-22b of FIGS. 22A. FIG. 22C is a cross-sectional view taken along line 22c-22c of FIG. 22A. Referring to the embodiments of FIGS. 22A through 22C, the gap-filling insulation layer 346 is formed so that the void A can be filled with the gap-filling insulation layer 346. The gap-filling insulation layer 346 may be at least one of vacuum, an oxide layer, a nitride layer, and/or a silicon layer.

Figure 23A:
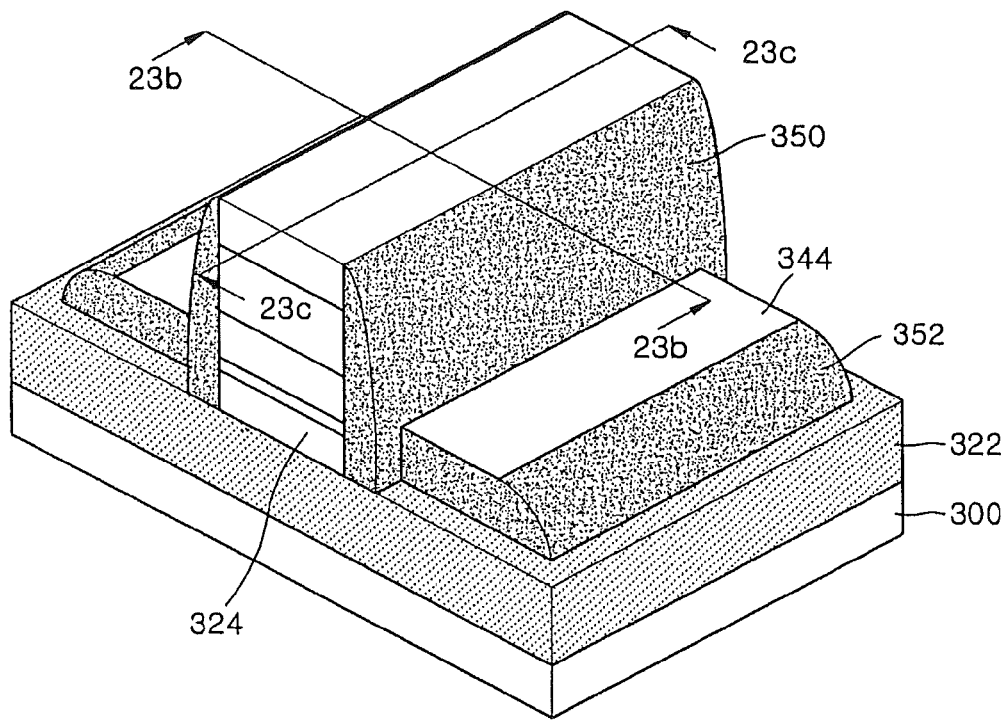
Figure 23B:
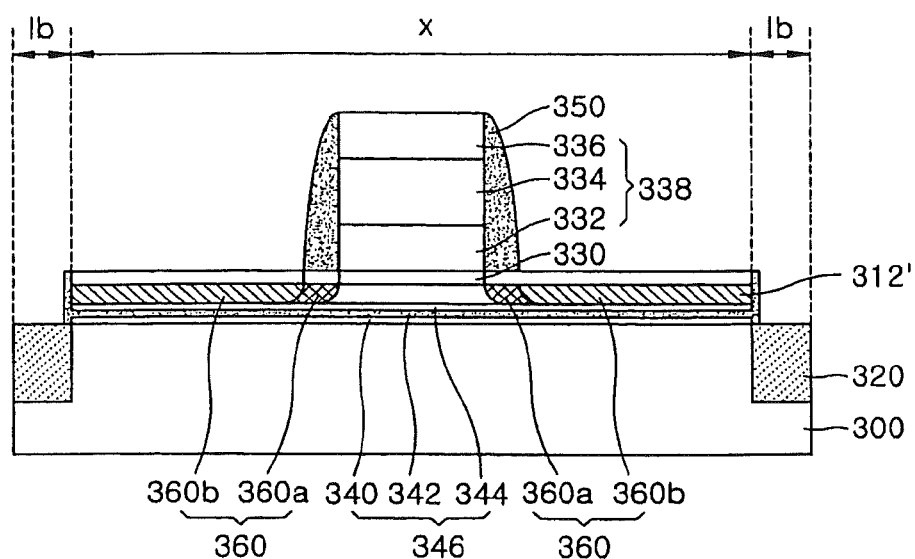
Figure 23C:
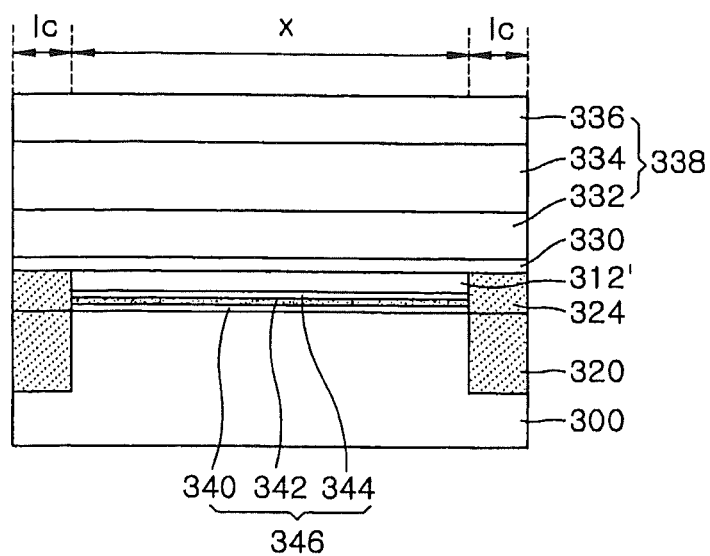

FIG. 23A is a perspective view illustrating a semiconductor device obtained by forming impurity regions in the structure of FIGS. 22A, 22B, and 22C. FIG. 23B is a cross-sectional view taken along line 23b-23b of FIG. 23A, FIG. 23C is a cross-sectional view taken along line 23c-23c of FIG. 23A, Referring to the embodiments of FIGS. 23A through 23C, an LDD impurity layer 360a (or an SDE impurity layer) is formed in portions of the active layer pattern 312' at either side of the gate electrode pattern 338 by, for example, implanting or diffusing first source/drain impurity ions into the portions of the active layer pattern 312' using the gate electrode pattern 338 as an ion implantation mask.

Fourth spacers 350 are formed on the sidewalls of the gate electrode pattern 338. An HDD impurity layer 360b is formed, for example, by implanting or diffusing second source/drain impurity ions into the active layer pattern 312' using the gate electrode pattern 338 and the fourth spacers 350 as ion implantation masks. Fifth spacers 352 may serve as liners limiting or even preventing damage to the isolation layer 320 caused by a subsequent heat treatment process.

As described above, according to some embodiments of the present invention, a bulk silicon device is formed in a region obtained by removing the sacrificial layer 310 from the structure of FIGS. 17A, 17B, and 17C, In addition, an SOI wafer is formed by filling the sacrificial layer pattern 310' with the gap-filling insulation layer 346. Therefore, it may be possible to form a bulk silicon device and an SOI device together on the semiconductor wafer 300. In other words, a semiconductor device may be formed in a predetermined area on an SOI wafer. Even when the active layer 312 is formed to be thicker than desired, the thickness of the active layer 312 can be reduced by repeatedly performing processes of forming an oxide layer on the active layer 312 through thermal oxidization and then removing the oxide layer.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A semiconductor device comprising:
   a semiconductor substrate;
   a stack structure protruding from the semiconductor substrate and surrounded by an isolation structure, the stack structure including an active layer pattern and a gap-filling insulation layer between the semiconductor substrate and the active layer pattern; and
   wherein the isolation structure includes a supporting isolation layer coupled to the active layer pattern that is configured to provide a support structure for the active layer pattern; and
   a spacer formed directly on the sidewalls of the active layer pattern and on sidewalls of the gap-filling insulation layer under the active layer pattern.

2. The semiconductor device of claim 1, wherein the gap-filling insulation layer comprises an oxide layer, a nitride layer and/or a silicon layer.

3. The semiconductor device of claim 1, further comprising a gate electrode extending from the isolation structure around the stack structure on the active layer pattern.

4. The semiconductor device of claim 3, wherein the active layer pattern includes a channel region located at a portion of the stack structure, and impurity regions located at both sides of the channel region, and
   wherein the gate electrode does not cover the impurity regions.

5. The semiconductor device of claim 3, wherein the gate electrode comprises a gate electrode of a silicon on insulator (SOI) device formed on the semiconductor substrate.

6. The semiconductor device of claim 3, wherein the agte electrode is formed on a recessed isolation layer at either side of the gap-filling insulation layer.

7. A semiconductor device having a channel region defined by an insulation layer, the semiconductor device comprising:
   an active layer pattern deposited on a gap-filling insulation layer on a semiconductor wafer;
   a supporting isolation layer that covers the sidewalls of the active layer pattern and the gap-filling insulation layer; and
   spacers which are firmed directly on sidewalls of the active layer pattern and on sidewalls of the gap-filling insulation layer under the avtice layer pattern.

8. The semiconductor device of claim 7, wherein the gap-filling insulation layer is composed of at least one of an oxide layer, a nitride layer, and/or a silicon layer.

9. The semiconductor device of claim 7, wherein the gap-filling insulation layer is an ONO layer, which is a stack of a first oxide layer, a nitride layer, and a second oxide layer.

10. The semiconductor device of claim 7 further comprising a gate electrode pattern, which is formed on a recessed isolation layer at either side of the gap-filling insulation layer.

* * * * *